US010478858B2

(12) United States Patent
Lasiter et al.

(10) Patent No.: US 10,478,858 B2
(45) Date of Patent: Nov. 19, 2019

(54) PIEZOELECTRIC ULTRASONIC TRANSDUCER AND PROCESS

(71) Applicant: QUALCOMM Incorporated, San Diego, CA (US)

(72) Inventors: Jon Bradley Lasiter, Stockton, CA (US); Ravindra Vaman Shenoy, Dublin, CA (US); Evgeni Petrovich Gousev, Saratoga, CA (US); Hrishikesh Panchawagh, San Jose, CA (US); David William Burns, San Jose, CA (US); Nai-Kuei Kuo, San Jose, CA (US); Jonathan Charles Griffiths, Fremont, CA (US); Suryaprakash Ganti, Los Altos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 863 days.

(21) Appl. No.: 14/569,256

(22) Filed: Dec. 12, 2014

(65) Prior Publication Data
US 2015/0165479 A1 Jun. 18, 2015

Related U.S. Application Data

(60) Provisional application No. 62/022,140, filed on Jul. 8, 2014, provisional application No. 61/915,361, filed on Dec. 12, 2013.

(51) Int. Cl.
*H01L 41/31* (2013.01)
*B06B 1/06* (2006.01)
(Continued)

(52) U.S. Cl.
CPC ............ *B06B 1/0666* (2013.01); *G06F 3/043* (2013.01); *G06F 3/0412* (2013.01);
(Continued)

(58) Field of Classification Search
CPC ..................................... B06B 1/0666
(Continued)

(56) References Cited

U.S. PATENT DOCUMENTS 6,381,197 B1 4/2002 Savord et al.
8,539,837 B2 9/2013 Wong et al.
(Continued)

FOREIGN PATENT DOCUMENTS

CN 101545971 A 9/2009
CN 100568020 C 12/2009
(Continued)

OTHER PUBLICATIONS

U.S. Office Action dated Apr. 20, 2016, issued in U.S. Appl. No. 14/569,280.
(Continued)

*Primary Examiner* — Thomas M Dougherty
*Assistant Examiner* — Karen B Addison
(74) *Attorney, Agent, or Firm* — Weaver Austin Villeneuve & Sampson LLP

(57) ABSTRACT

A piezoelectric micromechanical ultrasonic transducer (PMUT) includes a multilayer stack disposed on a substrate. The multilayer stack may include an anchor structure disposed over the substrate, a piezoelectric layer stack disposed over the anchor structure, and a mechanical layer disposed proximate to the piezoelectric layer stack. The piezoelectric layer stack may be disposed over a cavity. The mechanical layer may seal the cavity and, together with the piezoelectric layer stack, is supported by the anchor structure and forms a membrane over the cavity, the membrane being configured to undergo one or both of flexural motion and vibration when the PMUT receives or transmits ultrasonic signals.

22 Claims, 31 Drawing Sheets

(51) Int. Cl.
*G10K 9/125* (2006.01)
*G06F 3/041* (2006.01)
*G06F 3/043* (2006.01)
*G06K 9/00* (2006.01)

(52) U.S. Cl.
CPC ........... *G06F 3/0436* (2013.01); *G10K 9/125* (2013.01); *H01L 41/31* (2013.01); *G06K 9/0002* (2013.01); *G06K 9/00335* (2013.01); *Y10T 29/42* (2015.01)

(58) Field of Classification Search
USPC .................................................. 310/330–334
See application file for complete search history.

(56) References Cited

U.S. PATENT DOCUMENTS

| | | | |
|---|---|---|---|
| 8,581,865 B2 | 11/2013 | Choo et al. | |
| 8,890,853 B2 | 11/2014 | Schuele et al. | |
| 9,815,087 B2* | 11/2017 | Ganti | B06B 1/0666 |
| 2003/0067249 A1 | 4/2003 | Lockwood et al. | |
| 2003/0119220 A1 | 6/2003 | Mlcak et al. | |
| 2005/0081040 A1 | 4/2005 | Johnson et al. | |
| 2006/0181521 A1 | 8/2006 | Perreault et al. | |
| 2007/0040477 A1* | 2/2007 | Sugiura | B06B 1/0629 310/324 |
| 2008/0116765 A1 | 5/2008 | Sugiura et al. | |
| 2008/0179080 A1 | 7/2008 | Tanaka et al. | |
| 2009/0021475 A1 | 1/2009 | Steinle et al. | |
| 2009/0235750 A1 | 9/2009 | Chang et al. | |
| 2010/0013574 A1 | 1/2010 | Huang | |
| 2010/0045141 A1 | 2/2010 | Pulskamp et al. | |
| 2010/0045142 A1 | 2/2010 | Pulskamp et al. | |
| 2010/0052478 A1 | 3/2010 | Schneider et al. | |
| 2010/0237992 A1 | 9/2010 | Liautaud | |
| 2010/0239133 A1 | 9/2010 | Schmitt et al. | |
| 2010/0251824 A1 | 10/2010 | Schneider et al. | |
| 2011/0120843 A1 | 5/2011 | Wunnicke et al. | |
| 2011/0210554 A1 | 9/2011 | Boysel | |
| 2011/0285244 A1 | 11/2011 | Lewis et al. | |
| 2012/0062433 A1* | 3/2012 | Balanis | H01Q 1/38 343/720 |
| 2012/0069715 A1 | 3/2012 | Okuno | |
| 2012/0206014 A1 | 8/2012 | Bibl et al. | |
| 2013/0133428 A1 | 5/2013 | Lee et al. | |
| 2013/0201134 A1 | 8/2013 | Schneider et al. | |
| 2013/0294201 A1 | 11/2013 | Hajati | |
| 2013/0294202 A1 | 11/2013 | Hajati | |
| 2014/0253435 A1 | 9/2014 | Boser et al. | |
| 2015/0169136 A1 | 6/2015 | Ganti et al. | |

FOREIGN PATENT DOCUMENTS

| | | | |
|---|---|---|---|
| CN | 101712028 A | | 5/2010 |
| CN | 102422305 A | | 4/2012 |
| CN | 103493510 A | | 1/2014 |
| CN | 101712028 A | * | 5/2017 |
| CN | 1017120228 | * | 5/2017 |
| JP | H1043185 A | | 2/1998 |
| JP | 2004088056 A | | 3/2004 |
| JP | 2004274721 A | | 9/2004 |
| JP | 2009223317 A | | 10/2009 |
| JP | 2009230736 A | | 10/2009 |
| JP | 2009260723 A | | 11/2009 |
| JP | 2010165341 A | | 7/2010 |
| JP | 2010218365 A | | 9/2010 |
| JP | 2012125560 A | | 7/2012 |
| JP | 2015505633 | | 2/2015 |
| WO | WO-2006093913 A2 | | 9/2006 |
| WO | WO2010053156 A1 | | 5/2010 |
| WO | 2011112622 A1 | | 9/2011 |
| WO | WO2015009635 A1 | | 1/2015 |
| WO | WO2015089453 A1 | | 6/2015 |
| WO | WO2016007250 A1 | | 1/2016 |

OTHER PUBLICATIONS

U.S. Final Office Action dated Sep. 30, 2016, issued in U.S. Appl. No. 14/569,280.
International Preliminary Report on Patentability and Written Opinion—PCT/US2014/070114—ISA/EPO—dated Jun. 23, 2016.
International Search Report and Written Opinion—PCT/US2015/034729—ISA/EPO—dated Nov. 13, 2015.
Second Written Opinion of the International Preliminary Examining Authority—PCT/US2015/034729—ISA/EPO—dated Jul. 1, 2016.
International Preliminary Report on Patentability and Written Opinion—PCT/US2015/034729—ISA/EPO—dated Sep. 26, 2016.
International Search Report and Written Opinion—PCT/US2014/070114—ISA/EPO—dated Mar. 19, 2015.
U.S. Office Action dated Mar. 14, 2017, issued in U.S. Appl. No. 14/569,280.
U.S. Notice of Allowance dated Sep. 8, 2017, issued in U.S. Appl. No. 14/569,280.
Siu T., et al., "MEMS-Based Ultrasonic Devices", Taylor and Francis Group, LLC, 2008, pp. 1-8.

* cited by examiner

PIEZOELECTRIC ULTRASONIC TRANSDUCER AND PROCESS

CROSS-REFERENCE TO RELATED APPLICATIONS

This disclosure claims priority to U.S. Provisional Patent Application No. 62/022,140, filed Jul. 8, 2014, entitled "PIEZOELECTRIC ULTRASONIC TRANSDUCER AND PROCESS," and to Provisional Patent Application No. 61/915,361, filed on Dec. 12, 2013 and entitled "MICROMECHANICAL ULTRASONIC TRANSDUCERS AND DISPLAY," which are hereby incorporated by reference.

TECHNICAL FIELD

This disclosure relates to a piezoelectric transducer and to techniques for fabricating piezoelectric transducers, and more particularly to a piezoelectric ultrasonic transducer suitable for use in an electronic sensor array or interactive display for biometric sensing, imaging, and touch or gesture recognition.

DESCRIPTION OF THE RELATED TECHNOLOGY

Thin film piezoelectric ultrasonic transducers are attractive candidates for numerous applications including biometric sensors such as fingerprint sensors, gesture detection, microphones and speakers, ultrasonic imaging, and chemical sensors. The transducers typically include a piezoelectric stack suspended over a cavity. The piezoelectric stack may include a layer of piezoelectric material and a layer of patterned or unpatterned electrodes on each side of the piezoelectric layer.

FIG. 1 is an elevation view of a piezoelectric ultrasonic transducer. As shown in FIG. 1, it is known to configure a piezoelectric ultrasonic transducer 100 such that it includes a piezoelectric layer stack 110 disposed over a mechanical layer 130 and a cavity 120 that may be formed in, for example, a silicon-on-insulator (SOI) wafer. The piezoelectric layer stack 110 includes a piezoelectric layer 115 with associated lower electrode 112 and upper electrode 114 disposed, respectively below and above the piezoelectric layer 115. The cavity 120 may be formed in a semiconductor substrate 160 such as a silicon wafer or in some implementations, a silicon-on-insulator (SOI) wafer. The mechanical layer 130 may be formed from an active silicon layer of the SOI wafer.

Portions of the present disclosure relate to micromechanical ultrasonic transducers, aspects of which have been described in U.S. Provisional Patent Application No. 61/915,361, filed on Dec. 12, 2013 and entitled "MICROMECHANICAL ULTRASONIC TRANSDUCERS AND DISPLAY," and in a U.S. patent application Ser. No. 14/569, 280 filed concurrently herewith, and entitled "MICROMECHANICAL ULTRASONIC TRANSDUCERS AND DISPLAY", assigned to the assignee of the present invention and hereby incorporated by reference into the present application in its entirety for all purposes.

SUMMARY

The systems, methods and devices of this disclosure each have several innovative aspects, no single one of which is solely responsible for the desirable attributes disclosed herein.

One innovative aspect of the subject matter described in this disclosure relates to a piezoelectric micromechanical ultrasonic transducer (PMUT) including a multilayer stack disposed on a substrate. The multilayer stack includes an anchor structure disposed over the substrate, a piezoelectric layer stack disposed over the anchor structure, and a mechanical layer disposed proximate to the piezoelectric layer stack. The piezoelectric layer stack is disposed over a cavity. The mechanical layer seals the cavity and, together with the piezoelectric layer stack, is supported by the anchor structure and forms a membrane over the cavity, the membrane being configured to undergo one or both of flexural motion and vibration when the PMUT receives or transmits acoustic or ultrasonic signals. In some examples, the mechanical layer may have a thickness such that a neutral axis of the multilayer stack is displaced, relative to a neutral axis of the piezoelectric layer stack, towards the mechanical layer to allow an out-of-plane bending mode. In some examples, the mechanical layer may be substantially thicker than the piezoelectric layer stack. In some examples, the neutral axis may pass through the mechanical layer.

In some examples, the cavity may be formed by removing a sacrificial material through at least one release hole, the mechanical layer may be formed after removing the sacrificial material, and forming the mechanical layer may seal the cavity by sealing the at least one release hole.

In some examples, the piezoelectric layer stack may include a piezoelectric layer, a lower electrode disposed below the piezoelectric layer, and an upper electrode disposed above the piezoelectric layer.

In some examples, the mechanical layer may include a recess where the mechanical layer is locally thinned.

In some examples, the mechanical layer may be disposed over a side of the piezoelectric stack opposite to the substrate.

In some examples, the mechanical layer may be disposed below a side of the piezoelectric stack facing the substrate.

In some examples, the PMUT may further include an acoustic coupling medium disposed above the piezoelectric layer stack, wherein the PMUT is configured to receive or transmit ultrasonic signals through the coupling medium.

According to some implementations, a PMUT includes a multilayer stack disposed on a substrate. The multilayer stack includes an anchor structure disposed over the substrate, a piezoelectric layer stack disposed over the anchor structure, and a mechanical layer disposed proximate to the piezoelectric layer stack, the mechanical layer including a recess where the mechanical layer is locally thinned. The piezoelectric layer stack is disposed over a cavity and the mechanical layer, together with the piezoelectric layer stack, is supported by the anchor structure and forms a membrane over the cavity, the membrane being configured to undergo one or both of flexural motion and vibration when the PMUT receives or transmits ultrasonic signals.

In some examples, the cavity may be formed by removing a sacrificial material through at least one release hole, the mechanical layer may be formed after removing the sacrificial material, and forming the mechanical layer may seal the cavity by sealing the at least one release hole.

According to some implementations, a method of making a PMUT includes forming an anchor structure over a substrate, the anchor structure disposed proximate to regions of sacrificial material, forming a piezoelectric layer stack over the anchor structure, removing the sacrificial material so as to form a cavity under the piezoelectric layer stack, and disposing a mechanical layer proximate to the piezoelectric layer stack, wherein the piezoelectric layer stack and the mechanical layer form part of a multilayer stack, the mechanical layer seals the cavity and, together with the piezoelectric layer stack, is supported by the anchor structure and forms a membrane over the cavity, the membrane being configured to undergo one or both of flexural motion and vibration when the PMUT receives or transmits ultrasonic signals.

In some examples, removing the sacrificial material may form a cavity under the piezoelectric layer stack.

In some examples, removing the sacrificial material may include removing the sacrificial material through at least one release hole and the mechanical layer seals the at least one release hole.

In some examples, the anchor structure may be disposed in a lower layer, the lower layer being parallel to the piezoelectric stack layer and including the regions of sacrificial material.

In some examples, the mechanical layer may have a thickness such that a neutral axis of the multilayer stack is displaced relative to a neutral axis of the piezoelectric layer stack and towards the mechanical layer to allow an out-of-plane bending mode. In some examples, the mechanical layer is substantially thicker than the piezoelectric layer stack. In some examples, the neutral axis may pass through the mechanical layer.

According to some implementations, an apparatus includes an array of PMUT sensors and an acoustic coupling medium. At least one PMUT includes a multilayer stack disposed on a substrate. The multilayer stack includes an anchor structure disposed over the substrate, a piezoelectric layer stack disposed over the anchor structure and a cavity, and a mechanical layer disposed proximate to the piezoelectric layer stack, the mechanical layer sealing the cavity. The acoustic coupling medium is disposed above the piezoelectric layer stack and the PMUT is configured to receive or transmit ultrasonic signals through the coupling medium.

BRIEF DESCRIPTION OF THE DRAWINGS

Details of one or more implementations of the subject matter described in this specification are set forth in this disclosure and the accompanying drawings. Other features, aspects, and advantages will become apparent from a review of the disclosure. Note that the relative dimensions of the drawings and other diagrams of this disclosure may not be drawn to scale. The sizes, thicknesses, arrangements, materials, etc., shown and described in this disclosure are made only by way of example and should not be construed as limiting. Like reference numbers and designations in the various drawings indicate like elements.

DETAILED DESCRIPTION

Figure 1:
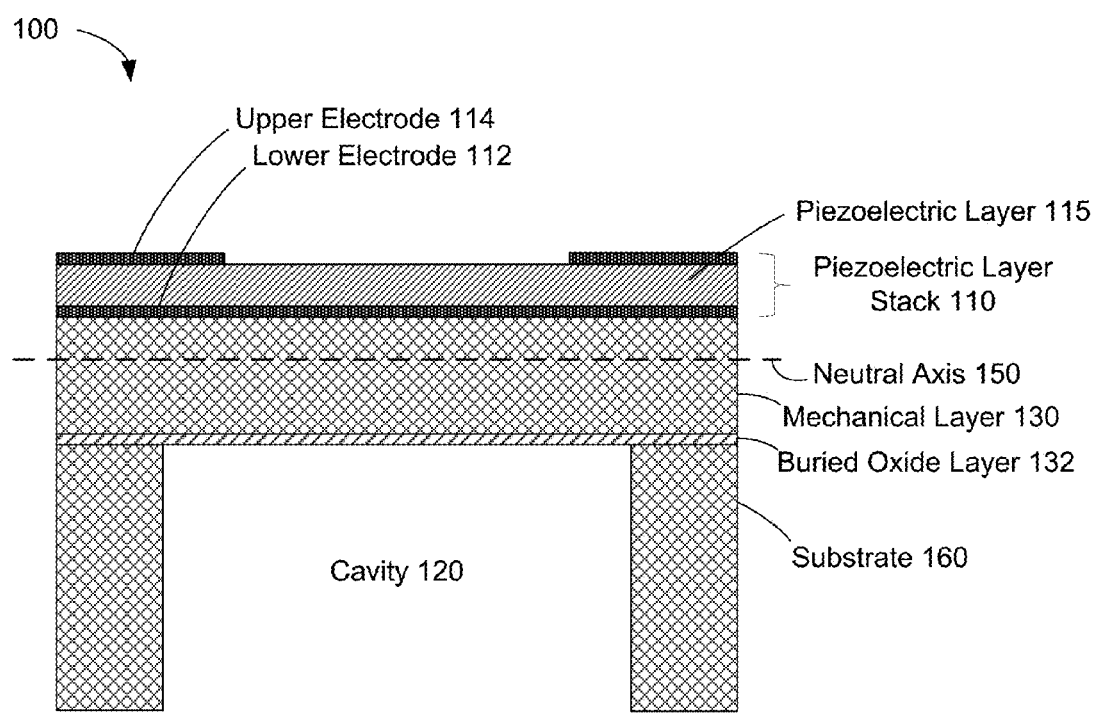
FIG. 1 is an elevation view of a piezoelectric ultrasonic transducer.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system that includes an ultrasonic sensor. For example, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also may be used in applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The systems, methods and devices of the disclosure each have several innovative aspects, no single one of which is solely responsible for the desirable attributes disclosed herein. One innovative aspect of the subject matter described in this disclosure can be implemented in a piezoelectric micromechanical ultrasonic transducer (PMUT) configured as a multilayer stack that includes a piezoelectric layer stack and a mechanical layer disposed over a cavity. The cavity may be formed in a lower layer of the multilayer stack, above which is formed the piezoelectric layer stack. A mechanical layer is disposed proximate to the piezoelectric layer stack. The mechanical layer may seal the cavity and, together with the piezoelectric layer stack, may be supported by an anchor structure and form a membrane over the cavity. The membrane may be configured to undergo one or both of flexural motion and vibration when the PMUT receives or transmits acoustic or ultrasonic signals. The anchor structure may be disposed on the substrate, in a lower layer that is parallel to the piezoelectric layer stack and includes one or more regions of sacrificial material. The sacrificial material may be removed sacrificially to form one or more cavities under the piezoelectric layer stack.

In some implementations, the mechanical layer has a thickness such that a neutral axis of the multilayer stack is displaced relative to a neutral axis of the piezoelectric layer stack and towards the mechanical layer to allow an out-of-plane bending mode. As a result, the neutral axis of the PMUT stack may be a distance removed from the piezoelectric layer in a direction opposite to the substrate. More particularly, the neutral axis may pass through the mechanical layer, in a plane that is above the piezoelectric layer stack and the cavity and is approximately parallel to the piezoelectric layer stack. In some implementations, the neutral axis of the PMUT stack may be a distance removed from the piezoelectric layer in a direction towards the substrate. More particularly, the neutral axis may pass through the mechanical layer, in a plane that is below the piezoelectric layer stack and is approximately parallel to the piezoelectric layer stack.

One innovative aspect of the subject matter described in this disclosure can be implemented in an apparatus that includes a one- or two-dimensional array of piezoelectric micromechanical ultrasonic transducer (PMUT) elements positioned below, beside, with, on, or above a backplane of a display or an ultrasonic fingerprint sensor array.

In some implementations, the PMUT array may be configurable to operate in modes corresponding to multiple frequency ranges. In some implementations, for example, the PMUT array may be configurable to operate in a low-frequency mode corresponding to a low-frequency range (e.g., 50 kHz to 200 kHz) or in a high-frequency mode corresponding to a high-frequency range (e.g., 1 MHz to 25 MHz). When operating in the high-frequency mode, an apparatus may be capable of imaging at relatively higher resolution. Accordingly, the apparatus may be capable of detecting touch, fingerprint, stylus, and biometric information from an object such as a finger placed on the surface of the display or sensor array. Such a high-frequency mode may be referred to herein as a fingerprint sensor mode, a touch mode, or a stylus mode.

When operating in the low-frequency mode, the apparatus may be capable of emitting sound waves that are capable of relatively greater penetration into air than when the apparatus is operating in the high-frequency mode. Such lower-frequency sound waves may be transmitted through various overlying layers including a cover glass, a touchscreen, a display array, a backlight, or other layers positioned between an ultrasonic transmitter and a display or sensor surface. In some implementations, a port may be opened through one or more of the overlying layers to optimize acoustic coupling from the PMUT array into air. The lower-frequency sound waves may be transmitted through the air above the display or sensor surface, reflected from one or more objects near the surface, transmitted through the air and back through the overlying layers, and detected by an ultrasonic receiver. Accordingly, when operating in the low-frequency mode, the apparatus may be capable of operating in a gesture detection mode, wherein free-space gestures near the display may be detected.

Alternatively, or additionally, in some implementations, the PMUT array may be configurable to operate in a medium-frequency mode corresponding to a frequency range between the low-frequency range and the high-frequency range (e.g., about 200 kHz to about 1 MHz). When operating in the medium-frequency mode, the apparatus may be capable of providing touch sensor functionality, although with somewhat less resolution than the high-frequency mode.

The PMUT array may be addressable for wavefront beam forming, beam steering, receive-side beam forming, and/or selective readout of returned signals. For example, individual columns, rows, sensor pixels and/or groups of sensor pixels may be separately addressable. A control system may control an array of transmitters to produce wavefronts of a particular shape, such as planar, circular or cylindrical wave fronts. The control system may control the magnitude and/or phase of the array of transmitters to produce constructive or destructive interference in desired locations. For example, the control system may control the magnitude and/or phase of the array of transmitters to produce constructive interference in one or more locations in which a touch or gesture has been detected.

In some implementations, PMUT devices may be co-fabricated with thin-film transistor (TFT) circuitry on the same substrate, which may be a glass or plastic substrate in some examples. The TFT substrate may include row and column addressing electronics, multiplexers, local amplification stages and control circuitry. In some implementations, an interface circuit including a driver stage and a sense stage may be used to excite a PMUT device and detect responses from the same device. In other implementations, a first PMUT device may serve as an acoustic or ultrasonic transmitter and a second PMUT device may serve as an acoustic or ultrasonic receiver. In some configurations, different PMUT devices may be capable of low- and high-frequency operation (e.g. for gestures and for fingerprint detection). In other configurations, the same PMUT device may be used for low- and high-frequency operation. In some implementations, the PMUT may be fabricated using a silicon wafer with active silicon circuits fabricated in the silicon wafer. The active silicon circuits may include electronics for the functioning of the PMUT or PMUT array.

FIGS. 2A-2D show examples of implementations of a PMUT stack, configured in accordance with the presently disclosed techniques. In the illustrated implementation, a PMUT 200A includes a mechanical layer 230 disposed above a piezoelectric layer stack 210. The piezoelectric layer stack 210 includes a piezoelectric layer 215 with associated lower electrode 212 and upper electrode 214 disposed, respectively below and above the piezoelectric layer 115. Mechanical layer 230 is disposed over a side of the piezoelectric stack opposite to the substrate.

The mechanical layer 230 is disposed above a side of the piezoelectric layer stack 210 opposite to a cavity 220 and, together with the piezoelectric layer stack 210, may form a drum-like membrane over the cavity 220. The membrane may be configured to undergo flexural motion and/or vibration when the PMUT receives or transmits acoustic or ultrasonic signals. In the implementation illustrated in FIG. 2A, the piezoelectric layer stack 210 is between the cavity 220 and the mechanical layer 230 whereas, in the configuration illustrated in FIG. 1, the mechanical layer 130 of PMUT 100 is between the piezoelectric layer stack 110 and the cavity 120. In some implementations, the mechanical layer 230 may be substantially thicker that the piezoelectric layer stack.

The mechanical layer 230 may be made of an electrically insulating material and may be deposited towards the end of the microfabrication process, i.e. after forming and patterning of the piezoelectric layer stack 210 and the cavity 220 over which the piezoelectric layer stack 210 is disposed. The mechanical layer 230 may be configured to have dimensions and mechanical properties such that a neutral axis 250 of the PMUT stack is a distance above the piezoelectric layer stack 210. More particularly, the neutral axis 250 is disposed in a plane that includes the mechanical layer 230 above the piezoelectric layer stack 210. It may be observed that the mechanical layer 230 is proximate to a side of the piezoelectric layer stack 210 that is opposite to the cavity 220 and to the substrate 260. In some implementations, the neutral axis 250 may be disposed in a plane that is substantially parallel to the piezoelectric layer stack 210, passing though the piezoelectric layer stack 210 a distance apart from the neutral axis of the piezoelectric layer stack 210 in a direction towards the mechanical layer 230.

For many multi-layer microstructural devices that include a piezoelectric layer, it is preferable for the neutral axis of the multilayer stack to be a distance apart from the neutral axis of the piezoelectric layer. For example, the mechanical layer 230 of the presently disclosed PMUT causes the neutral axis 250 of the multilayer stack to be a distance apart from the neutral axis of the piezoelectric layer 210. The distance may be determined by the thicknesses of various layers and their elastic properties, which in turn may be determined by resonant frequency and quality factor requirements for the transducer. In some implementations, the neutral axis 250 may be a distance apart from the neutral axis of the piezoelectric layer 210 and displaced towards the mechanical layer 230, yet the neutral axis 250 may still reside within the piezoelectric layer or within the piezoelectric stack. For example, the mechanical layer 230 may have a thickness to allow an out-of-plane bending mode of the multilayer stack. In some implementations, the mechanical layer 230 may be configured to allow the multilayer stack to be primarily excited in an out-of-plane mode, for example a piston mode or a fundamental mode. The out-of-plane mode can cause displacement of portions of the multilayer stack proximate to the cavity 220 (which may be referred to herein as the "released portions"), for example, at the center of a circular, square, or rectangular shaped PMUT. In some implementations, displacement of the neutral axis 250 permits transducer operation in a $d_{31}$ or $e_{31}$ mode in which the neutral axis of the multilayer stack of the membrane in the transducing area may be offset from the neutral axis of the active piezoelectric material in the stack.

As will be described in more detail below, the mechanical layer 230 may be configured to provide an encapsulation layer that seals cavity 220. In addition, the mechanical layer 230 may serve as a passivation layer for electrodes of the piezoelectric layer stack 210. By judicious selection of material properties, thickness and internal stress of the mechanical layer 230, certain transducer parameters may be improved. For example, the resonant frequency, static and dynamic deflections, acoustic pressure output, as well as membrane shape (bow) that may result from residual stresses in various layers may be tuned by appropriately configuring the mechanical layer 230.

In some implementations, the mechanical layer 230 may be configured to provide planarization for attachment of an acoustic coupling layer, for building electrical circuitry after transducer fabrication and/or to provide an insulating layer to create additional routing layers on top of the mechanical layer 230 for capacitive de-coupling with respect to the piezoelectric layer stack 210.

Figure 2A:
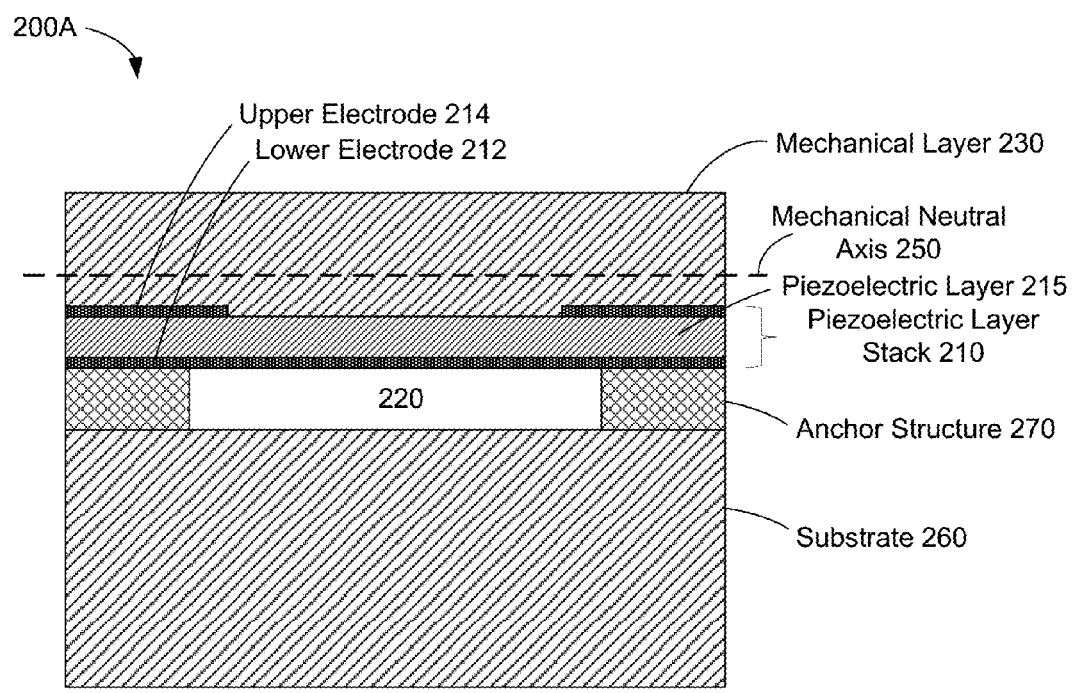
FIGS. 2A-2D show examples of implementations of a PMUT stack, configured in accordance with the presently disclosed techniques.
Figure 2B:
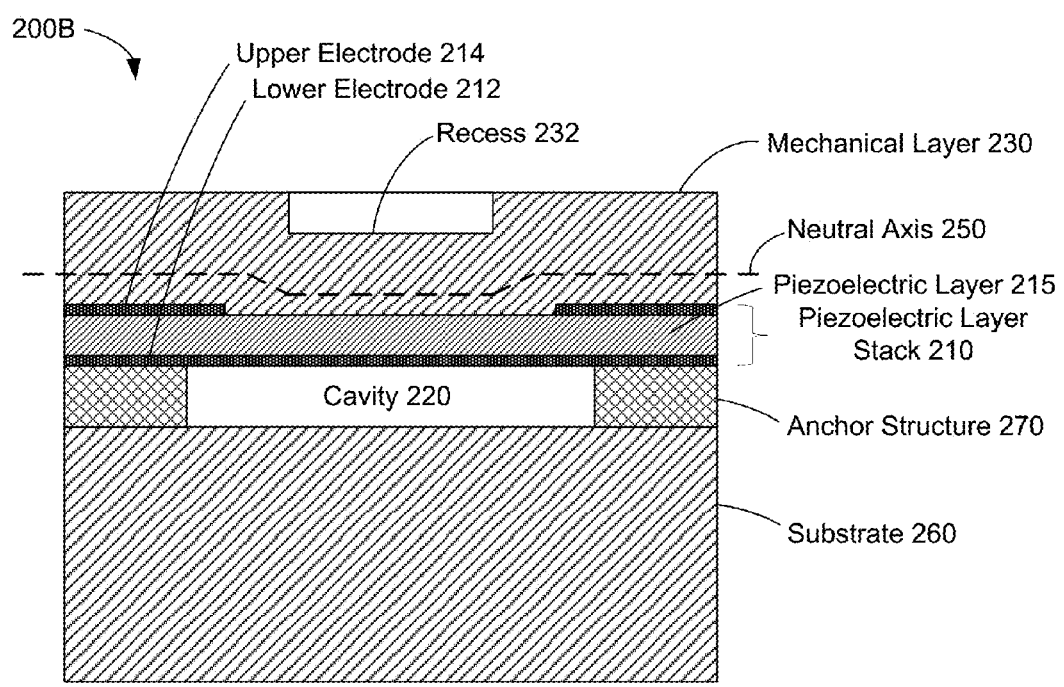

In some implementations, the mechanical layer 230 may include a recess that reduces the total thickness of part of the PMUT stack. The size and geometry of the recess and recess features may be designed to influence transducer parameters such as resonant frequency, static and dynamic deflections, acoustic pressure output, mechanical quality factor (Q), and membrane shape (bow). FIG. 2B shows a cross-sectional view of a PMUT structure having a recess 232 formed in an upper portion of the mechanical layer 230, where the mechanical layer is locally thinned. In the implementation shown, the recess 232 is formed in a central region of the mechanical layer 230 of PMUT 200B.

It may be observed that the neutral axis 250 moves downwards towards the cavity 220 proximate to the recess 232. The recess 232 may include a substantially axisymmetric feature such as a circle or a ring formed partially into a circular PMUT diaphragm near the diaphragm center, or an angular trench or portions of an angular trench formed near the periphery of a circular diaphragm. In some implementations, the recess 232 may include a square or rectangular feature formed into the mechanical layer 230 near the center of a square or rectangular PMUT diaphragm. In some implementations, recess 232 may include features such as narrow rectangles, local trenches, or slots formed near the periphery of a square, rectangular or circular diaphragm. In some implementations, a sequence of radial slots may be combined with central or peripheral recess features. In some implementations, the recess or recessed features may be formed by etching partially or substantially through the mechanical layer 230, stopping on the underlying piezoelectric layer stack 210. In some implementations, the recess 232 and/or features thereof may be formed into the mechanical layer 230 based, for example, on an etch time. In some implementations, the mechanical layer 230 may include two or more deposited layers, one of which may serve as an etch stop or barrier layer to allow precise definition of the recess and recessed features during fabrication.

Figure 2C:
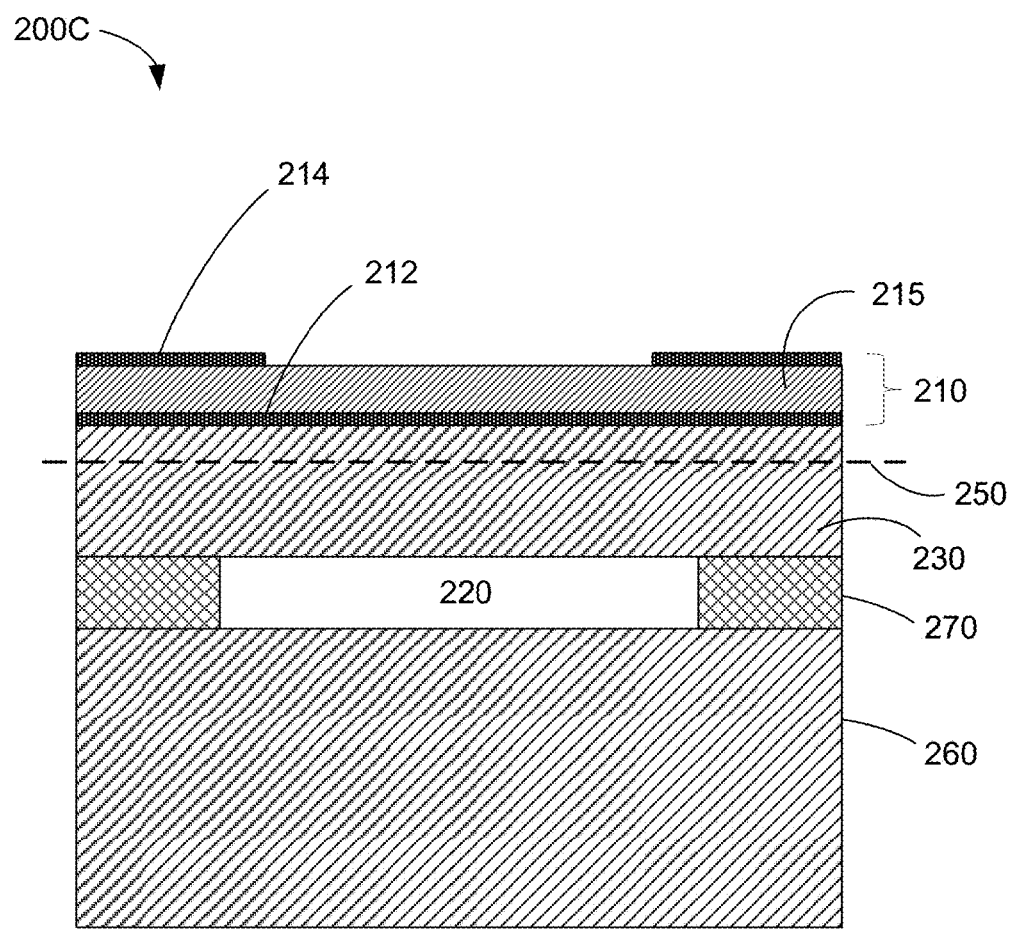

FIG. 2C shows another example of an implementation of a PMUT stack, configured in accordance with the presently disclosed techniques. In the illustrated implementation, the mechanical layer 230 of PMUT 200C is disposed above the cavity 220 and below the piezoelectric layer stack 210. Thus, the mechanical layer 230 is disposed below a side of the piezoelectric layer stack 210 that is facing the cavity 220 and the substrate 260. Together with the piezoelectric layer stack 210, the mechanical layer 230 may form a drum-like membrane or diaphragm over the cavity 220 which is configured to undergo flexural motion and/or vibration when the PMUT receives or transmits acoustic or ultrasonic signals. In some implementations, the mechanical layer 230 may be substantially thicker that the piezoelectric layer stack.

As will be described in more detail below, the mechanical layer 230 may be configured to provide an encapsulation layer that seals cavity 220. By judicious selection of material properties, thickness and internal stress of the mechanical layer 230, certain transducer parameters may be improved. For example, the resonant frequency, static and dynamic deflections, acoustic pressure output, as well as membrane shape (bow) that may result from residual stresses in various layers may be tuned by appropriately configuring the mechanical layer 230.

Figure 2D:
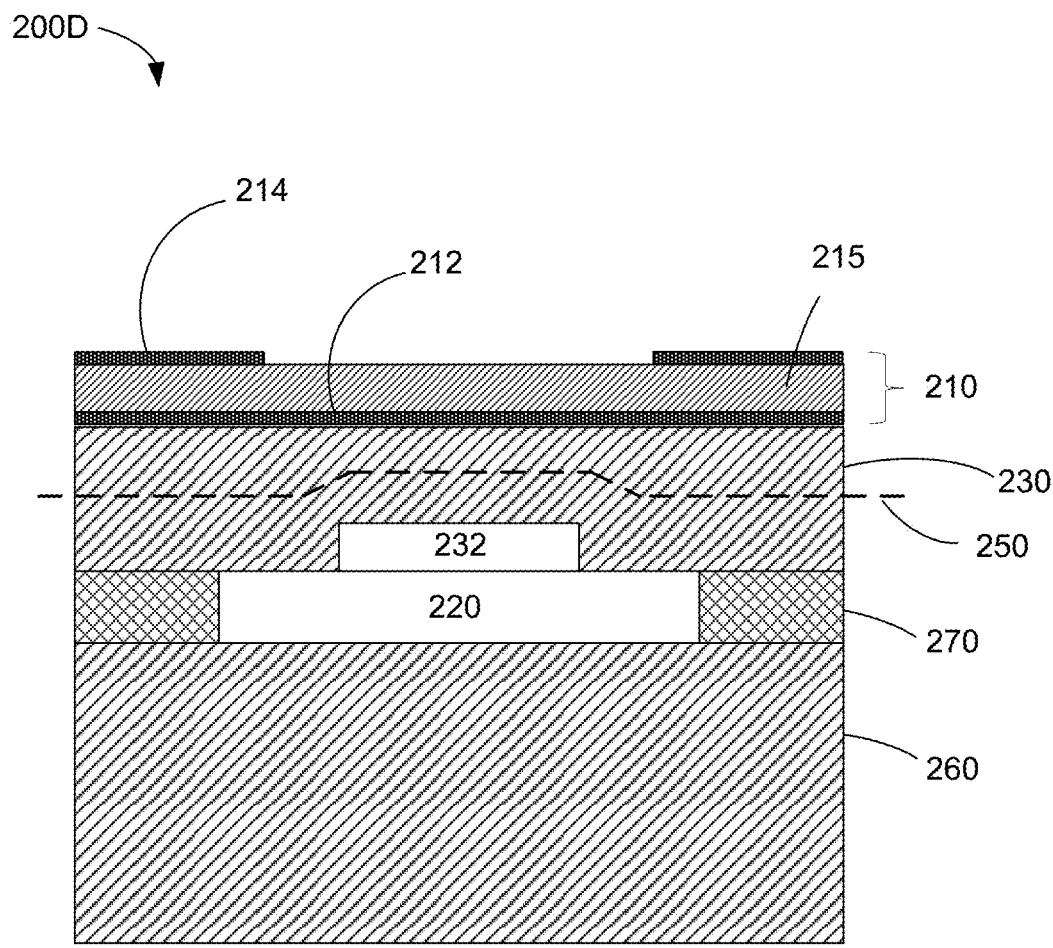

In some implementations, the mechanical layer 230 may include a recess that reduces the total thickness of part of the PMUT stack. The size and geometry of the recess and recess features may be designed to influence transducer parameters such as resonant frequency, static and dynamic deflections, acoustic pressure output, mechanical quality factor (Q), and membrane shape (bow). FIG. 2D shows a cross-sectional view of a PMUT structure having a recess 232 formed in the lower portion of the mechanical layer 230, where mechanical layer 230 is locally thinned. In the implementation shown, the recess 232 is formed in a central region of the mechanical layer 230 of PMUT 200D.

The recess 232 may include a substantially axisymmetric feature such as a circle or a ring formed partially into a circular PMUT diaphragm near the diaphragm center, or an angular trench or portions of an angular trench formed near the periphery of a circular diaphragm. In some implementations, the recess 232 may include a square or rectangular feature formed into the mechanical layer 230 near the center of a square or rectangular PMUT diaphragm. In some implementations, recess 232 may include features such as narrow rectangles, local trenches, or slots formed near the periphery of a square, rectangular or circular diaphragm. In some implementations, a sequence of radial slots may be combined with central or peripheral recess features. In some implementations, the recess or recessed features may be formed by etching partially through an underlying sacrificial layer (not shown) prior to deposition of the mechanical layer 230 and piezoelectric layer stack 210. In some implementations, the recess 232 and/or features thereof may be formed by etching partially into the underlying sacrificial layer based on an etch time. In some implementations, the sacrificial layer may include a stack of two or more deposited layers, one of which may allow local raised portions of the sacrificial layer to be formed prior to deposition of the mechanical layer 230 and piezoelectric layer stack 210, and one of which may serve as an etch stop or barrier layer to allow precise definition of the recess and recessed features during fabrication. In some implementations, the upper surface of mechanical layer 230 may be planarized prior to forming the piezoelectric layer stack 210. For example, mechanical layer 230 may be planarized with chemical-mechanical polishing (CMP), also referred to as chemical-mechanical planarization.

Figure 3:
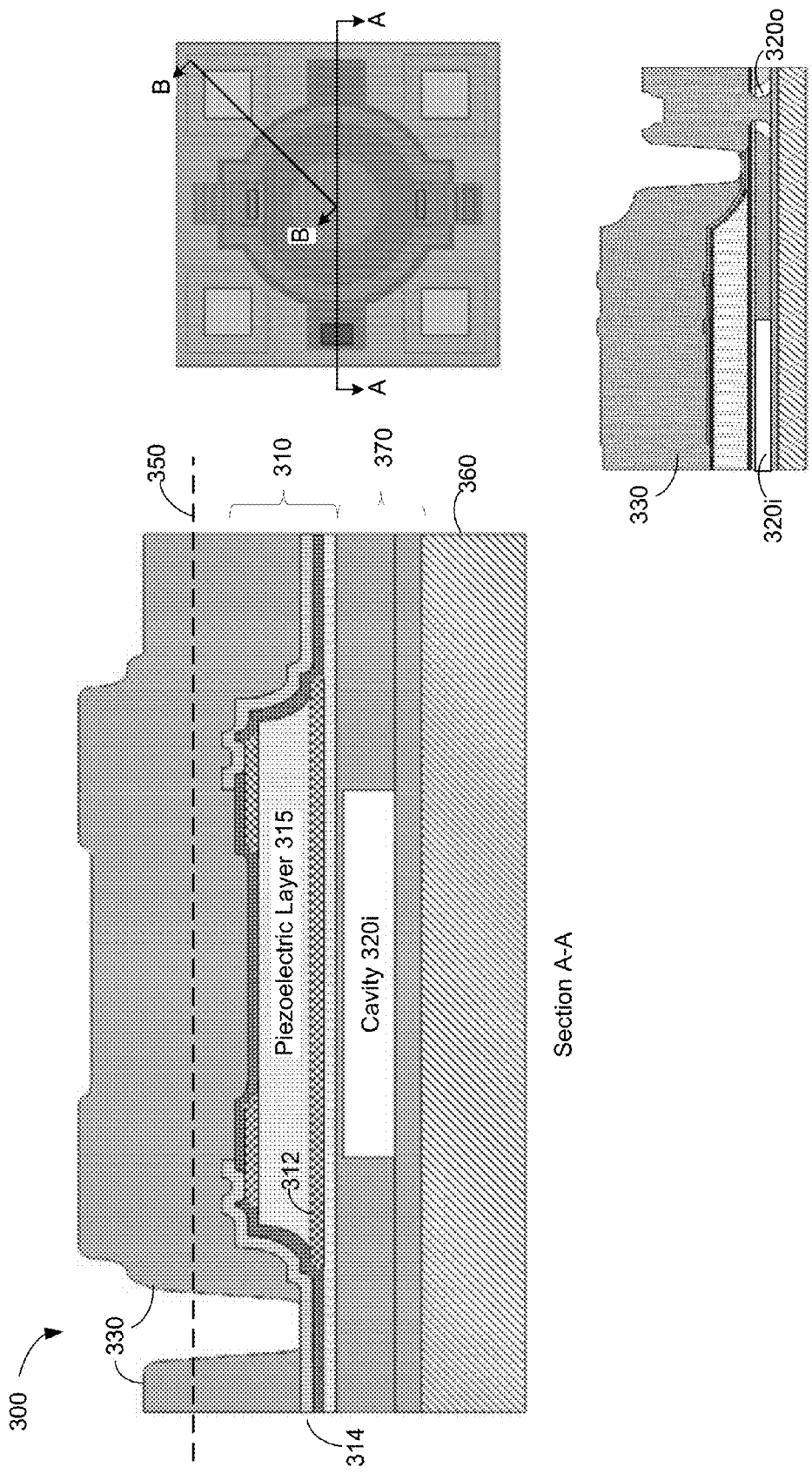
FIG. 3 illustrates an example implementation of a PMUT.

A better understanding of the presently disclosed techniques may be obtained by referring next to FIG. 3. FIG. 3 illustrates an example implementation of a PMUT. The illustrated PMUT 300 includes a piezoelectric layer stack 310 disposed above a cavity 320$i$. As described in more detail hereinbelow, the cavity 320$i$ may be formed by removal of a sacrificial layer formed within an anchor structure 370 through one or more release holes 320$o$. The anchor structure 370 may be deposited on a substrate 360, as described in more detail below. For scalability, it is preferred that these structures are made using processes common in IC, MEMS and LCD industries.

In the illustrated implementation, the piezoelectric layer stack 310 includes a piezoelectric layer 315 disposed between a lower electrode 312 and an upper electrode 314. A mechanical layer 330 is disposed above a side of the piezoelectric layer stack 310 opposite to a cavity 320$i$ and, together with the piezoelectric layer stack 310, may form a drum-like membrane or diaphragm over the cavity 320$i$ which is configured to undergo flexural motion and/or vibration when the PMUT receives or transmits acoustic or ultrasonic signals. In some implementations, the mechanical layer 330 may be configured so as to provide that the neutral axis 350 is disposed substantially external to (above) the piezoelectric layer stack 310. Advantageously, the mechanical layer 330 may serve as an encapsulation layer that seals the one or more release holes 320$o$ and isolates the cavity 320$i$ from external liquids and gases, as shown in Section B-B of FIG. 3, while also providing additional structural support for the PMUT 300.

Figure 4A:
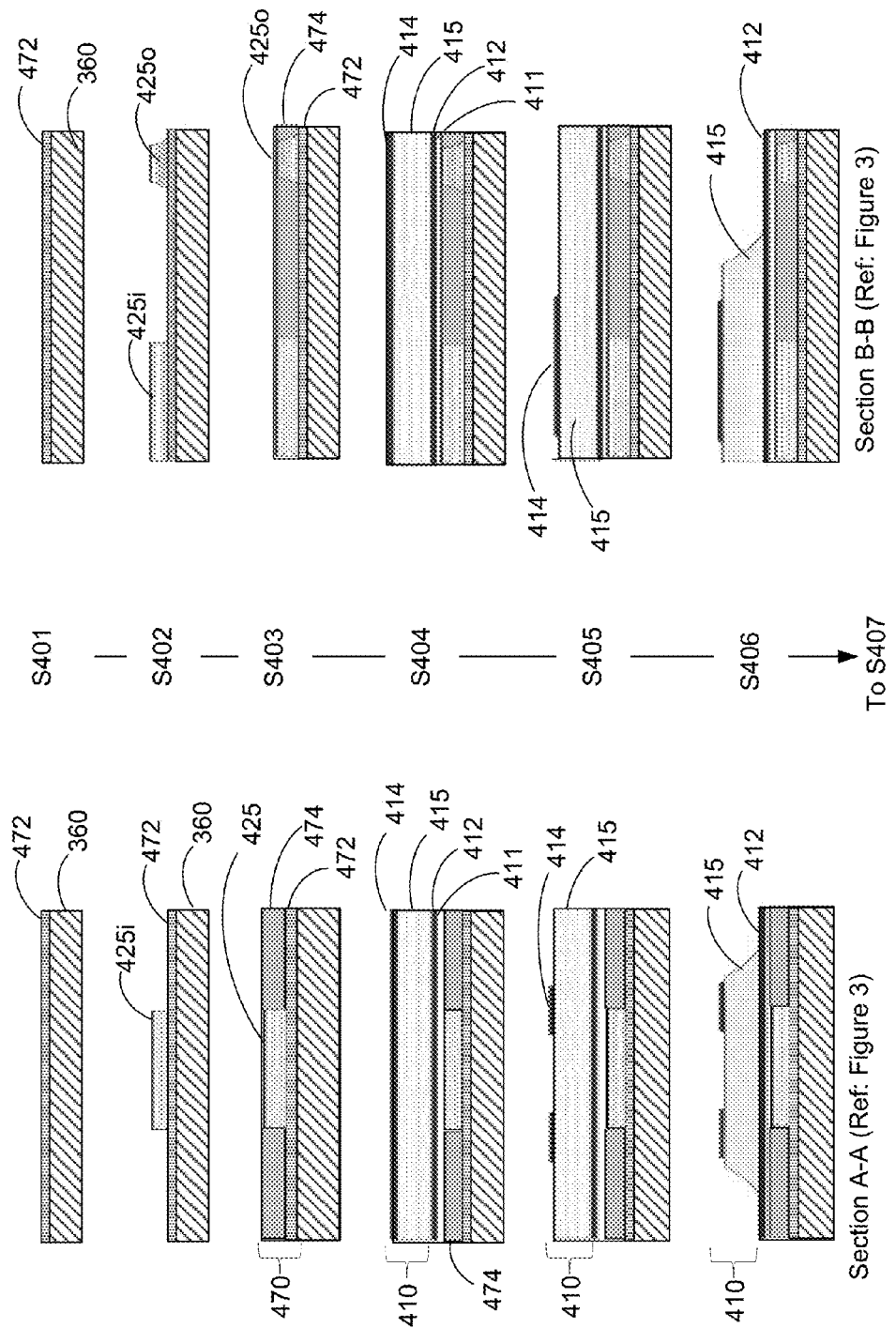
FIGS. 4A and 4B illustrate an example of a process flow for fabricating a PMUT.
Figure 4B:
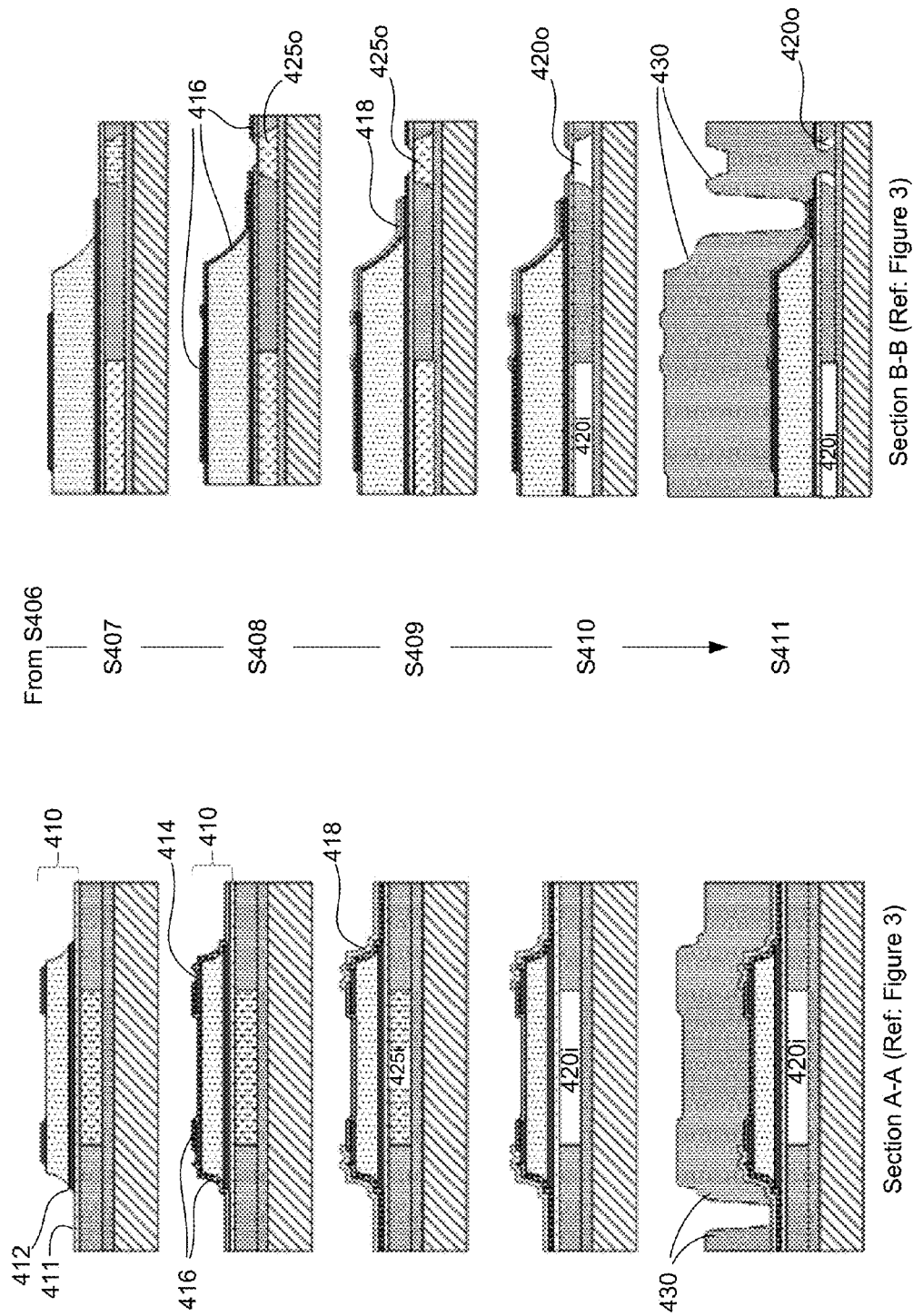

FIGS. 4A and 4B illustrate an example of a process flow for fabricating a PMUT. In the illustrated example, at step S401, a first layer portion 472 of an anchor structure 470 is deposited onto substrate 360. The first layer portion 472 may also be referred to as an oxide buffer layer. In some implementations, the oxide buffer layer 472 may be a silicon dioxide ($SiO_2$) layer having a thickness in the range of about 500 to about 30,000 Å. For example, in an implementation the thickness of the oxide buffer layer 472 is about 5,000 Å. The substrate 360 may be a glass substrate, a silicon wafer, or other suitable substrate material.

In the illustrated example, at step S402, sacrificial regions 425$i$ and 425$o$ may be formed by first depositing a sacrificial layer 425 of a sacrificial material that may include amorphous silicon (a-Si), polycrystalline silicon (poly-Si), or a combination of a-Si and poly-Si onto the oxide buffer layer 472. Alternatively, other sacrificial layer materials may be used such as molybdenum (Mo), tungsten (W), polyethylene carbonate (PEC), polypropylene carbonate (PPC) or polynorbornene (PNB). Step S402 may also include patterning and etching the sacrificial layer 425 to form the sacrificial regions 425$i$ and 425$o$. Inner sacrificial region 425$i$ may be disposed at a location corresponding to cavity 320$i$ of FIG. 3, whereas outer sacrificial region 425$o$ may be disposed at a location corresponding to the release hole 320$o$. One or more release channels or release vias of sacrificial layer material (not illustrated) may connect the outer sacrificial region 425$o$ with the inner sacrificial region 425$i$. In some implementations using PEC, PPC or PNB, release channels or release vias may not be needed to form underlying cavities in the PMUTs, as these sacrificial materials may be thermally decomposed to produce gaseous byproducts such as carbon dioxide ($CO_2$), monatomic or diatomic hydrogen, or monatomic or diatomic oxygen that may diffuse through the somewhat permeable overlying layers. In some implementations, the sacrificial layer 425 has a thickness in the range of about 500 to 20,000 Å. For example, in an implementation the thickness of the sacrificial layer 425 is about 10,000 Å.

In the illustrated example, at step S403, an anchor portion 474 of the anchor structure 470 is deposited onto the oxide buffer layer 472, so as to encompass the sacrificial regions 425$i$ and 425$o$. In some implementations, the anchor portion 474 may be an $SiO_2$ layer having a thickness in the range of about 750 to about 22,000 Å. For example, in an implementation the thickness of the anchor portion 474 is about 12,000 Å. Following deposition, the anchor portion 474 may optionally undergo chemical mechanical planarization (CMP) to planarize the upper portions of the deposited layers. Alternatively, or in addition, the anchor portion 474 may be thinned with a chemical, plasma, or other material removal method.

In the illustrated example, at step S404, a piezoelectric layer stack 410 is formed on the anchor structure 470. More particularly, in some implementations a sequence of deposition processes may be carried out that results in a first layer (or "barrier layer") 411 of aluminum nitride (AlN), silicon dioxide ($SiO_2$) or other suitable etch-resistant layer being deposited onto the anchor structure 470 and sacrificial regions 425*i* and 425*o*; a lower electrode layer 412 of molybdenum (Mo), platinum (Pt) or other suitable conductive material being deposited onto the barrier layer 411; a piezoelectric layer 415 such as AlN, zinc oxide (ZnO), lead-zirconate titanate (PZT) or other suitable piezoelectric material being deposited onto the lower electrode layer 412; and an upper electrode layer 414 of Mo, Pt or other suitable conductive layer being deposited onto the piezoelectric layer 415. In some implementations, the barrier layer 411 may have a thickness in the range of about 300 to 1000 Å. For example, in an implementation the thickness of the barrier layer 411 is about 500 Å. In some implementations, the lower electrode layer 412 may have a thickness in the range of about 1000 to 30,000 Å. For example, in an implementation the thickness of the lower electrode layer 412 is about 1000 Å. In some implementations, the piezoelectric layer 415 may have a thickness in the range of about 1000 to 30,000 Å. For example, in an implementation the thickness of the active piezoelectric layer 415 is about 10,000 Å. In some implementations, the upper electrode layer 414 may have a thickness in the range of about 1000 to 30,000 Å. For example, in an implementation the thickness of the upper electrode layer 414 is about 1000 Å. The first layer or barrier layer 411 may, in some implementations, serve as a seed layer for the subsequent lower electrode and/or piezoelectric layer deposition.

Following step S404, a sequence of patterning and forming operations may be executed so as to selectively expose, in a desired geometric configuration, the various layers included in the piezoelectric layer stack 410. In the illustrated example, at step S405, the upper electrode layer 414 of molybdenum may undergo patterning and etching to expose selected areas of the piezoelectric layer 415. At step S406, the piezoelectric layer 415 of AlN or other piezoelectric material may undergo patterning and etching so as to expose selected areas of lower electrode layer 412. At step S407, the lower electrode layer 412 of molybdenum may undergo patterning and etching so as to us expose selected areas of barrier layer 411.

In the illustrated example, at step S408, an isolation layer 416 may be deposited onto the upper electrode layer 414 and other surfaces exposed during the preceding masking and etching operations of steps S404 through S407. In some implementations, the isolation layer 416 may be $SiO_2$, for example, and have a thickness in the range of about 300 to 5,000 Å. For example, in an implementation the thickness of the isolation layer 416 is about 750 Å. Step S408 may also include patterning and etching the isolation layer 416 so as to expose selected areas of upper electrode layer 414, lower electrode layer 412, and outer sacrificial region 425*o*. In some implementations using thermally decomposable sacrificial materials such as PEC, PPC or PNB, patterning and etching the isolation layer 416 need not expose any outer sacrificial regions 425*o*.

In the illustrated example, at step S409, a metal interconnect layer 418 may be deposited onto the surfaces exposed during the preceding masking and etching operations of step S408. The interconnect layer 418 may be aluminum, for example, and have a thickness in the range of about 1000 to 50,000 Å. For example, in an implementation the thickness of interconnect layer 418 is about 1000 Å. Step S409 may also include patterning and etching the interconnect layer 418 so as to expose selected areas of the isolation layer 416 and the outer sacrificial region 425*o*. In implementations using thermally decomposable sacrificial materials, patterning and etching the interconnect layer 418 need not expose any outer sacrificial regions 425*o*.

In the illustrated example, at step S410, the sacrificial material, deposited at step S402 to form inner sacrificial region 425*i* and outer sacrificial region 425*o*, may be removed, thereby forming release hole 420*o* and cavity 420*i*. Removal of the sacrificial material from the inner sacrificial region 425*i*, the outer sacrificial region 425*o*, and one or more connecting release channels between the outer and inner sacrificial regions 425*o* and 425*i* may occur through the release hole 420*o*. For example, the a-Si/PolySi sacrificial layer 425 may be removed by exposing the sacrificial material to an etchant, for example xenon difluoride ($XeF_2$). By providing a release channel or via that couples outer sacrificial region 425*o* with inner sacrificial region 425*i*, substantially all of the sacrificial material of the inner sacrificial region 425*i* may be removed through the one or more release holes 420*o*. In some implementations using thermally decomposable sacrificial materials, raising the temperature of the substrate to a decomposition temperature (e.g. about 200 C for PEC and about 425 C for PNB) may selectively remove the sacrificial material, with gaseous byproducts diffusing through the overlying layers or emanating through any exposed release channels or vias during decomposition.

In the illustrated example, at step S411, a mechanical layer 430 may be deposited onto surfaces exposed during the preceding masking and etching operations of Step S409. The mechanical layer 430 may include $SiO_2$, SiON, silicon nitride (SiN), other dielectric material, or a combination of dielectric materials or layers. The mechanical layer 430 may have a thickness in the range of about 1000 to 50,000 Å. For example, in an implementation the thickness of mechanical layer 430 is about 20,000 Å. Step S409 may also include patterning and etching the mechanical layer 430 so as to achieve a desired profile. As illustrated in FIGS. 4A-4B, the mechanical layer 430 may be configured to mechanically seal (encapsulate) the release hole 420*o*. As a result, deposition of the mechanical layer 430 at step S411 may provide a substantial degree of isolation between the encapsulated cavity 420*i* and the ambient environment. The mechanical layer 430 may also serve as a passivation layer over the upper electrode layer 414 and other exposed layers. In implementations using thermally decomposable sacrificial materials, the deposition of the mechanical layer 430 may not be needed to seal or otherwise encapsulate the underlying cavity 420*i*.

Figure 5A:
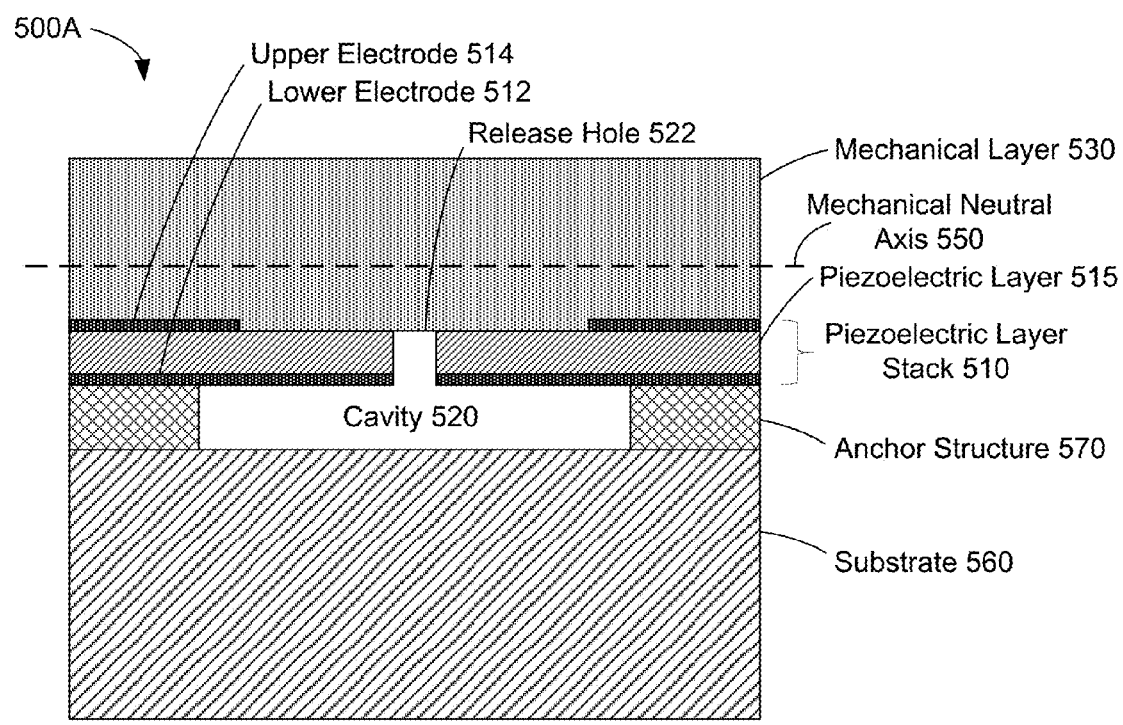
FIG. 5A shows a cross-sectional illustrative view of another implementation of a PMUT having a mechanical layer.

FIG. 5A shows a cross-sectional illustrative view of another implementation of a PMUT having a mechanical layer. In the illustrated implementation, PMUT 500A is formed by forming an anchor structure 570 on a substrate 560 such as a silicon wafer or a glass substrate. A piezoelectric layer stack 510, including a lower electrode layer 512, a piezoelectric layer 515 and an upper electrode layer 514, is formed on the anchor structure 570. A portion of the piezoelectric layer stack 510 is removed from the substrate 560 using, for example, a sacrificial etchant to selectively remove a sacrificial layer (not shown) and form a cavity 520 between the piezoelectric layer stack 510 and the substrate 560. Portions of the sacrificial layer in the cavity region may be accessed through a central release hole 522 that extends through a central portion of the piezoelectric layer stack 510 of the PMUT 500A. Alternatively, one or more release holes and release channels as described above may be used for sacrificial material removal to form the cavity 520. A mechanical layer 530 may be positioned on or otherwise disposed on the piezoelectric layer stack 510. The mechanical layer 530 may serve as a sealing layer for the release hole 522. The mechanical layer 530, together with the piezoelectric layer stack 510, may form a drum-like membrane over the cavity 520 which is configured to undergo flexural motion and/or vibration when the PMUT receives or transmits acoustic or ultrasonic signals. A neutral axis 550 passes through the mechanical layer 530, positioned above the piezoelectric layer stack 510 on a side opposite to the cavity 520. In some implementations, the neutral axis 550 may be disposed in a plane that is substantially parallel to the piezoelectric layer stack 510, passing though the piezoelectric layer stack 510 a distance apart from the neutral axis of the piezoelectric layer stack 510 in a direction towards the mechanical layer 530.

In some implementations, the mechanical layer 530 may be applied by laminating, adhering or otherwise bonding the mechanical layer 530 to an exposed upper surface of the piezoelectric layer stack 510. For example, the mechanical layer 530 may include a thick patternable film such as SU8, polyimide, a photosensitive silicone dielectric film, a cyclotene polymer film such as benzocyclobutene or BCB, a dry resist film, or a photo-sensitive material. Alternatively, the mechanical layer 530 may include a laminated layer of plastic such as polyethylene terephthalate (PET), polyethylene napthalate (PEN), polyimide (PI), polycarbonate (PC), a silicone, an elastomeric material, or other suitable material. The mechanical layer 530 may be laminated or otherwise bonded with an adhesive or other connective layer. Examples of adhesives include silicones, polyurethane, thermoplastics, elastomeric adhesives, thermoset adhesives, UV-curable adhesives, hot curing adhesives, hot-melt adhesives, phenolics, one- and two-part epoxies, cyanoacrylates, acrylics, acrylates, polyamides, contact adhesives and pressure sensitive adhesives (PSAs). The mechanical layer 530 may be deposited, coated, laminated, adhered or otherwise bonded directly or indirectly to the piezoelectric layer stack and may have a wide range of thicknesses, from less than 2 microns to over 500 microns, for example.

Figure 5B:
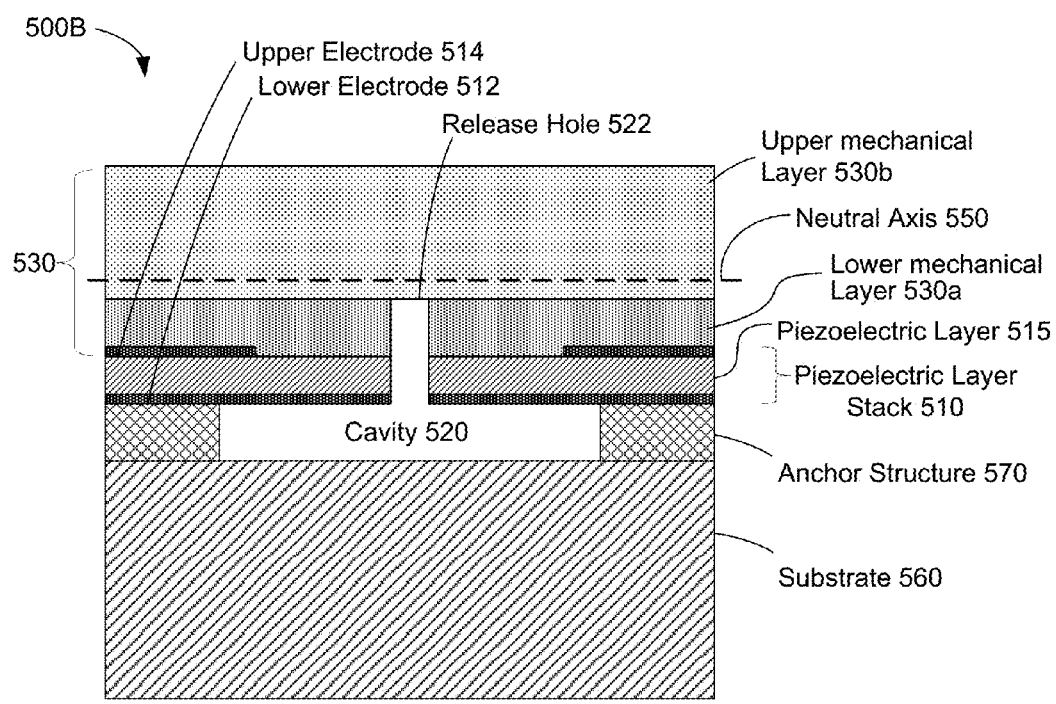
FIG. 5B shows a cross-sectional illustrative view of a yet further implementation of a PMUT stack having a mechanical layer.

FIG. 5B shows a cross-sectional illustrative view of a yet further implementation of a PMUT stack having a mechanical layer. In the illustrated implementation, the mechanical layer 530 of PMUT 500B includes an upper mechanical layer 530b that may be laminated or otherwise attached to a deposited lower mechanical layer 530a positioned above a piezoelectric layer stack 510 on a side opposite to the cavity 520 and substrate 560. The lower mechanical layer 530a may include one or more deposited layers, as described above. One or more release holes 522 may be formed in the lower mechanical layer 530a and in the underlying piezoelectric layer stack 510 to allow removal of sacrificial material to form the cavity 520. In the illustrated implementation, the release hole 522 may be sealed upon attachment of upper mechanical layer 530b onto an exposed upper surface of lower mechanical layer 530a. As a result, the upper mechanical layer 530b may serve as a sealing layer for the release hole 522. The neutral axis 550 may pass through either lower mechanical layer 530a or upper mechanical layer 530b, depending on the thicknesses and elastic moduli of the individual layers. In a region near the release hole 522, a central portion of the neutral axis 550 may be disposed at a location farther away from the cavity 520 than remaining portions of the neutral axis.

Figure 5C:
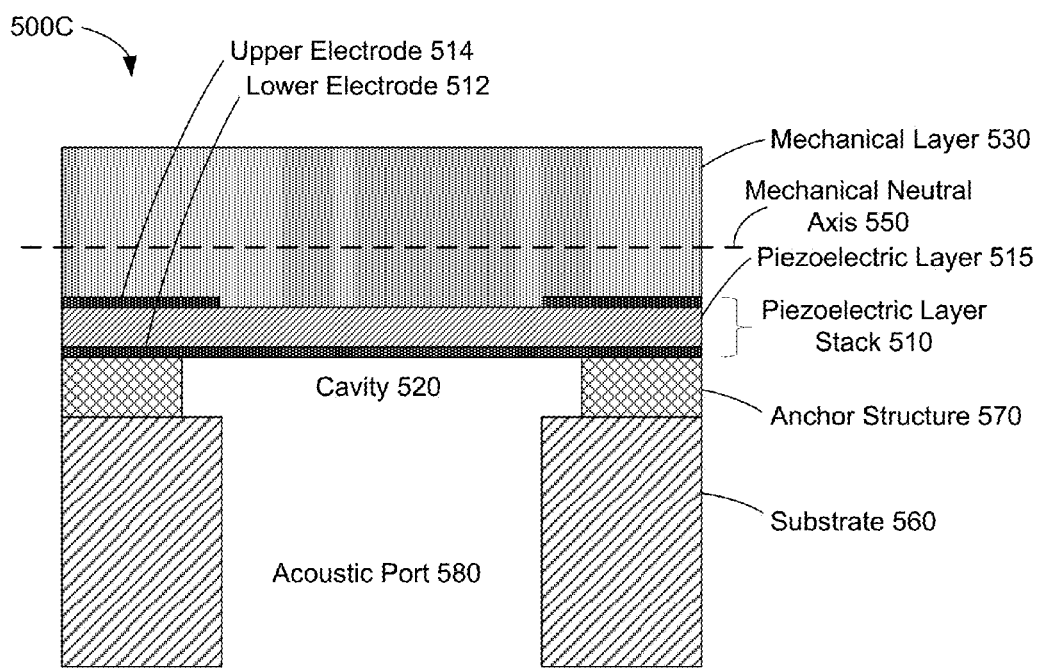
FIG. 5C shows a cross-sectional illustrative view of a PMUT having a top mechanical layer and an acoustic port formed in the substrate.

FIG. 5C shows a cross-sectional illustrative view of a PMUT having a top mechanical layer and an acoustic port formed in the substrate. The acoustic port 580 may be formed in the substrate 560 underneath the piezoelectric layer stack 510. The acoustic port 580 may be configured to provide acoustic coupling between the PMUT 500C and the backside of the substrate 560. The cross-sectional dimensions of the acoustic port 580 may be substantially the same, larger than, or smaller than the dimensions of a cavity 520 between the piezoelectric layer stack 510 and the acoustic port 580. The cavity 520 may be formed prior to or after formation of the acoustic port 580 by removal of sacrificial material in the cavity region. A mechanical layer 530 may be disposed on the piezoelectric layer stack 510. A neutral axis 550 of the multilayer stack may pass through the mechanical layer 530, separated by a distance from the piezoelectric stack 510 in a direction opposite to the cavity 520 and the acoustic port 580. The acoustic port 580 may allow the transmission of ultrasonic or acoustic waves from the PMUT 500C to a region exterior to the substrate 560. Similarly, the acoustic port 580 allows the reception of ultrasonic or acoustic waves by the PMUT 500C from a region exterior to the substrate 560.

Figure 6A:
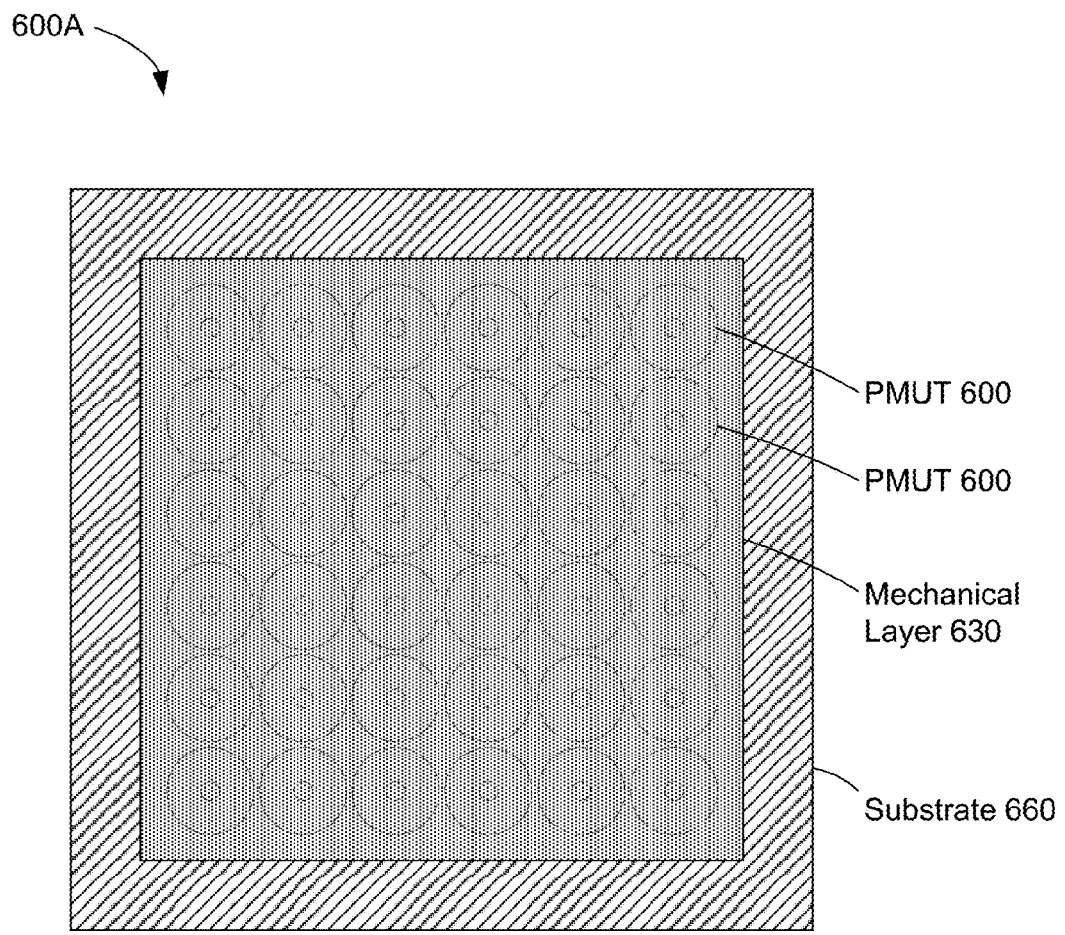
FIG. 6A illustrates a plan view of an array of PMUTs, according to some implementations.
Figure 6B:
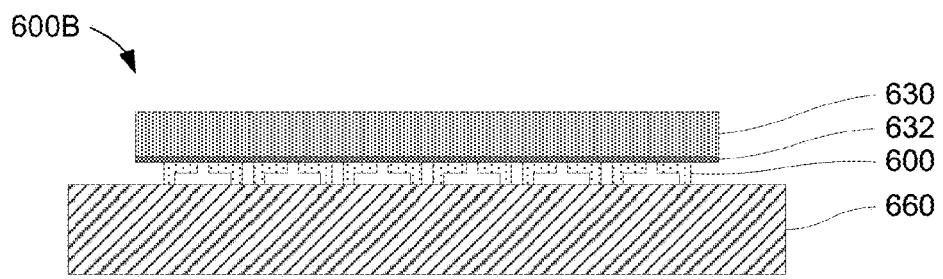
FIGS. 6B-6E show illustrative cross-sectional elevation views of PMUT arrays in various configurations.

FIGS. 5A-5C illustrate implementations of individual PMUTs and PMUT stacks, however the mechanical layer 530 may extend beyond an individual PMUT stack and cover one or more adjacent PMUTs. FIG. 6A illustrates a plan view of an array of PMUTs, according to some implementations. Each PMUT 600 is configured on a common substrate 660 with a bonded mechanical layer 630 extending over and between two or more PMUTs 600 in the PMUT array 600A. The bonded portion of mechanical layer 630 may serve as an acoustic coupling layer. In one mode of operation, the PMUTs 600 in the array may be simultaneously actuated to generate and transmit a quasi-plane wave from an upper surface of the mechanical layer 630. In some implementations, the mechanical layer 630 is continuous between adjacent PMUTs. In some implementations, the mechanical layer 630 may be patterned, diced, sliced, slit, cut or otherwise formed to align with the peripheries of PMUTs 600 or to selectively expose portions of one more layers underlying the mechanical layer 630 such as metal bond pads. Although the implementation illustrated in FIG. 6A includes an array of circular PMUTs 600, other shapes are within the contemplation of the present disclosure, such as square-shaped or rectangular-shaped PMUTs. For example, in some implementations, hexagonal-shaped PMUTs may be contemplated whereby an increase in packing density in terms of number of pixels per unit area may be obtained. The array of PMUTs 600 may be configured as a square or rectangular array as illustrated in FIG. 6A. In some implementations, the array may include staggered rows or columns of PMUTs 600, such as a triangular or hexagonal array.

FIGS. 6B-6E show illustrative cross-sectional elevation views of PMUT arrays in various configurations. PMUT array 600B includes an array of PMUTs 600 disposed on a substrate 660. An upper mechanical layer 630 may be laminated, bonded or otherwise attached to an upper surface of the array of PMUTs 600, such as with an adhesive layer 632. Flexural motions and/or vibrations of each PMUT 600 may bend, flex, compress or expand portions of the mechanical layer 630. In some implementations, synchronous vibrations of PMUTs 600 in the PMUT array 600B may launch substantially planar ultrasonic waves up and through the mechanical layer 630. In some implementations, the mechanical layer 630 may bend and flex with controlled actuation of underlying PMUTs 600 to launch acoustic or ultrasonic waves with controlled wavefronts, which may be useful for transmit-side beamforming applications. In some implementations, ultrasonic waves returning through the mechanical layer 630 may cause flexural motions and/or vibrations of the underlying PMUTs 600 and be detected accordingly. In some implementations, the mechanical layer 630 may serve as an acoustic coupling medium. In some implementations, the mechanical layer 630 may serve as an encapsulation layer that may mechanically encapsulate or otherwise seal cavities within PMUTs 600. The mechanical layer 630 may include, for example, a layer of polymer or plastic such as polycarbonate (PC), polyimide (PI), or polyethylene terephthalate (PET). The adhesive layer 632 may include a thin layer of epoxy, UV-curable material, pressure-sensitive adhesive (PSA), or other suitable adhesive material that couples the mechanical layer 630 to the PMUTs 600 in the PMUT array 600B.

Figure 6C:
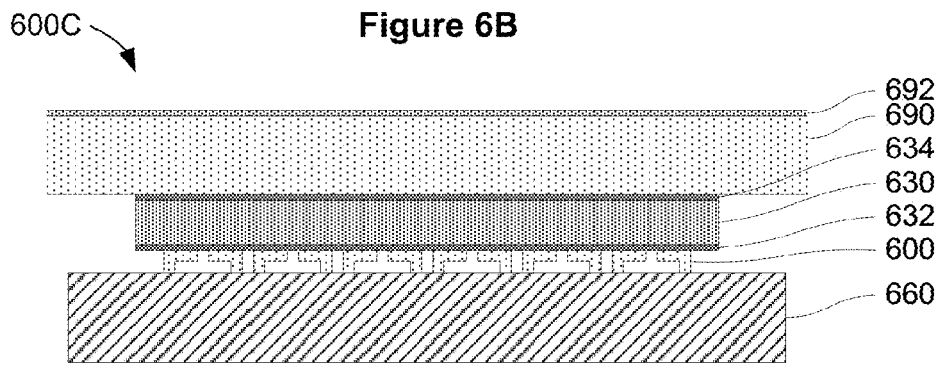

FIG. 6C illustrates a PMUT array 600C configured with a portion of a cover glass, enclosure wall, button cover or platen 690 overlying a mechanical layer 630 and an array of PMUTs 600 that are disposed on a substrate 660. Adhesive layers 632 and 634 may mechanically connect the mechanical layer 630 to the PMUTs 600 and the overlying platen 690. In some implementations, the mechanical layer 630 may provide acoustic coupling between the array of PMUTs 600 and the overlying platen 690 for use in ultrasonic fingerprint sensors, touch sensors, ultrasonic touch pads, stylus detection, biometric sensors, or other ultrasonic devices. An acoustic impedance matching layer 692 such as a polymeric coating may be deposited, screened, painted, adhered or otherwise disposed on an outer surface of the cover glass or platen 690. The acoustic matching layer 692 may serve as a scratch-resistant coating. Further description of the mechanical layer 630 is provided with respect to FIG. 6B above.

Figure 6D:
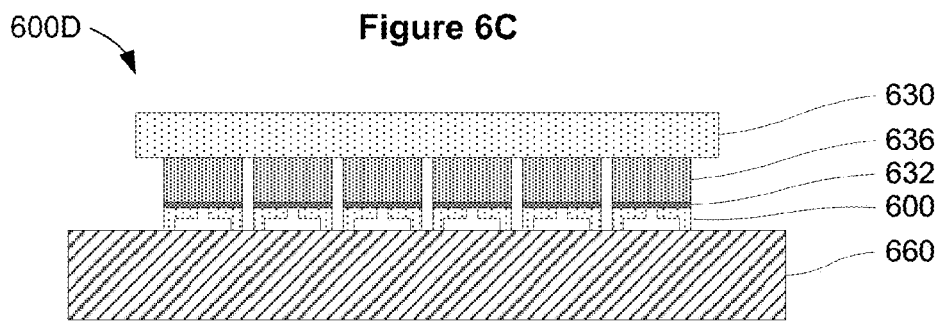

FIG. 6D illustrates a PMUT array 600D with a mechanical layer 630 coupled to an array of PMUTs 600 via an array of micropillars 636. The micropillars 636 may provide mechanical and acoustic coupling between PMUTs 600 and the overlying mechanical layer 630. The micropillars 636 may serve as acoustic waveguides, allowing acoustic or ultrasonic waves generated by the PMUTs 600 to travel through the waveguides with some level of acoustic isolation between neighboring PMUTs 600. Similarly, the micropillars 636 may serve as acoustic waveguides that can guide ultrasonic waves back to the PMUTs 600, which may act as either ultrasonic transmitters or ultrasonic receivers. In some implementations, the micropillars 636 may be substantially square, rectangular or circular in cross section, aligning substantially with the periphery of each PMUT 600 in the PMUT array 600D, with each micropillar 636 separated from a neighboring micropillar 636 by a gap. In some implementations, the micropillars 636 may be formed from a photo-patternable polymer, such as a photoresist or a photoimageable polymer laminate (e.g., a layer of SU-8 negative-acting photoresist, a photosensitive silicone dielectric film or a cyclotene polymer film). For example, a relatively thick layer of negative or positive photoresist may be applied to an upper surface of PMUTs 600 on the substrate 660, dried, patterned with a suitable photomask, developed, and baked to form the micropillars 636. In some implementations, a dry-resist photo-patternable film, also known as a dry-resist film, may be pre-patterned prior to alignment and attachment to the array of PMUTs 600. The dry-resist film may have a layer of photo-sensitive material on a relatively inert backing layer such as acetate, PC, PI or PET. In some implementations, an adhesion promoter or adhesive layer 632 may be positioned between the micropillars 636 and the underlying PMUTs 600 to provide mechanical and acoustic coupling. In some implementations, the backing layer for the dry-resist film may be removed. Alternatively, the backing layer for the dry-resist film may be retained and serve as a mechanical layer 630. The acoustic waveguides (e.g. micropillars 636) formed photolithographically on one or more PMUTs 600 may provide a low-cost batch process with tight alignment and geometry definition capability for PMUTs disposed on a substrate or configured in a PMUT array. In some implementations, a polymer laminate may be used as a tent to cover a plurality of release holes associated with the PMUTs 600 while planarizing the PMUT topology prior to attachment of a cover glass or platen.

Figure 6E:
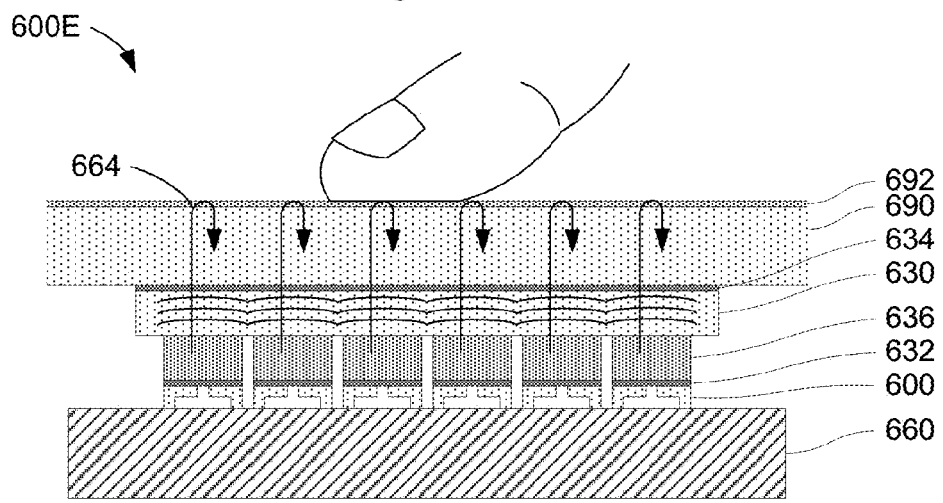

FIG. 6E illustrates a PMUT array 600E with an array of micropillars 636 and a platen 690 serving as a fingerprint sensor array. An acoustic matching layer 692 may be disposed on an outer surface of a cover glass or platen 690. PMUTs 600 in the PMUT array 600E on a substrate 660 may generate and transmit ultrasonic waves 664 that propagate through the micropillars 636, through an optional mechanical layer 630, and into the platen 690. A portion of the ultrasonic waves 664 may reflect back from an outer surface of the platen 690 or acoustic matching layer 692, with an amplitude dependent in part on the acoustic mismatch between the platen 690 or acoustic matching layer 692 and an overlying object such as the fingerprint ridges and valleys of a finger of a user placed in contact with the outer surface of the platen 690. The reflected waves may travel back through the acoustic matching layer 692 and platen 690, through optional mechanical layer 630 and micropillars 636, and be detected by the underlying PMUTs 600. Adhesive layers 632 and 634 may serve to mechanically and acoustically couple together various layers of the PMUT array 600E.

Figure 7A:
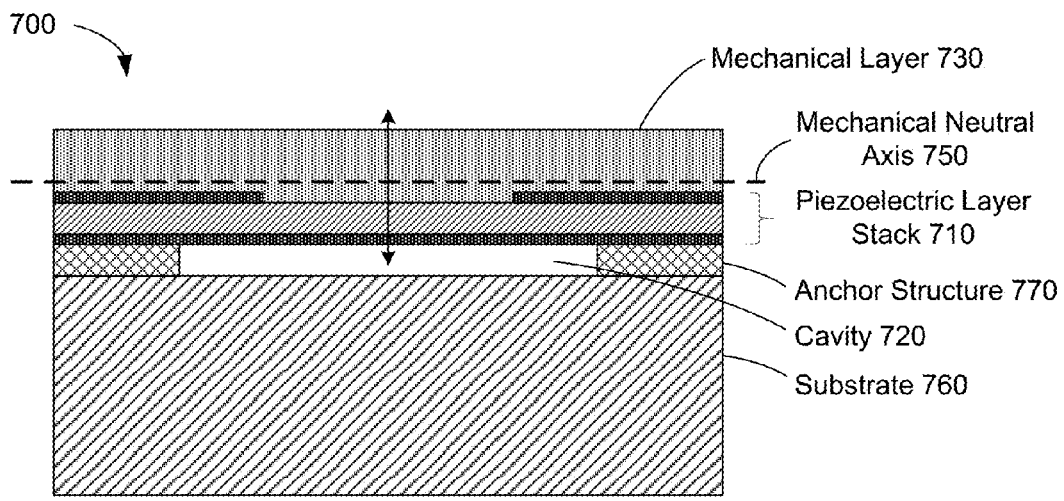
FIGS. 7A-7F show cross-sectional elevation views of various anchor structure configurations for a PMUT.

FIGS. 7A-7F show cross-sectional elevation views of various anchor structure configurations for a PMUT 700. FIG. 7A shows a peripheral anchor structure 770 positioned between a substrate 760 and a piezoelectric layer stack 710 having a mechanical layer 730 formed thereon. The mechanical layer 730, together with the piezoelectric layer stack 710, may form a drum-like membrane or diaphragm over a cavity 720 and may be configured to undergo flexural motion and/or vibration when the PMUT receives or transmits acoustic or ultrasonic signals. In the illustrated implementations, a mechanical neutral axis 750 passes through the mechanical layer 730 and above the piezoelectric layer stack 710 and cavity 720. In some implementations, the neutral axis 750 may be displaced relative to the neutral axis of the piezoelectric layer stack 710 and towards the mechanical layer 730 that is positioned above the piezoelectric layer stack 710, to allow out-of-plane bending modes.

Figure 7B:
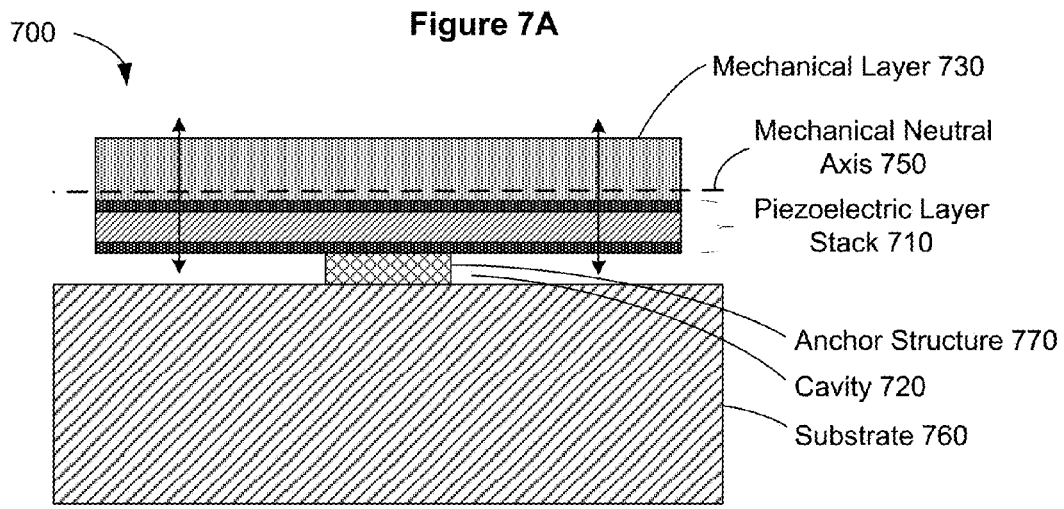
Figure 7C:
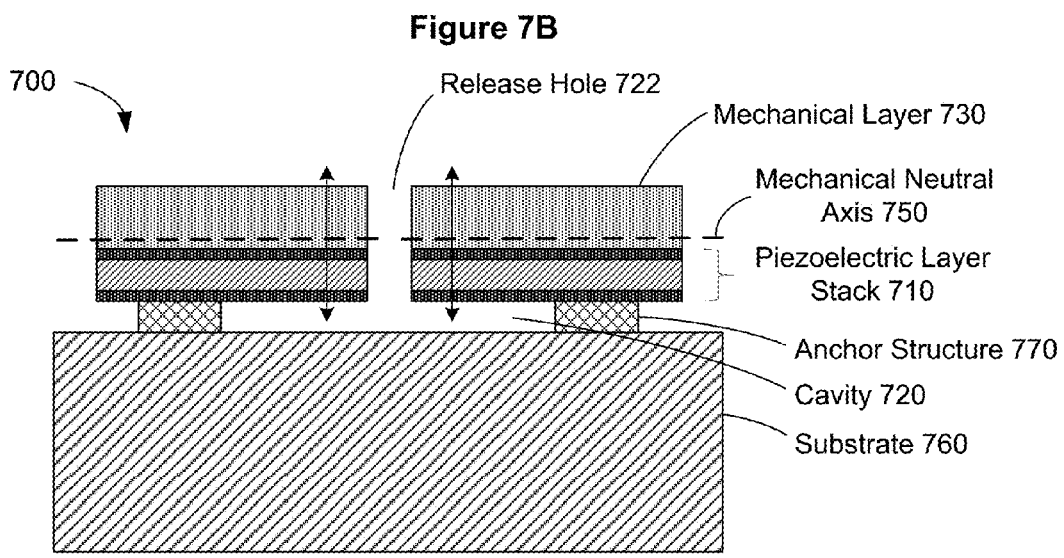
Figure 7D:
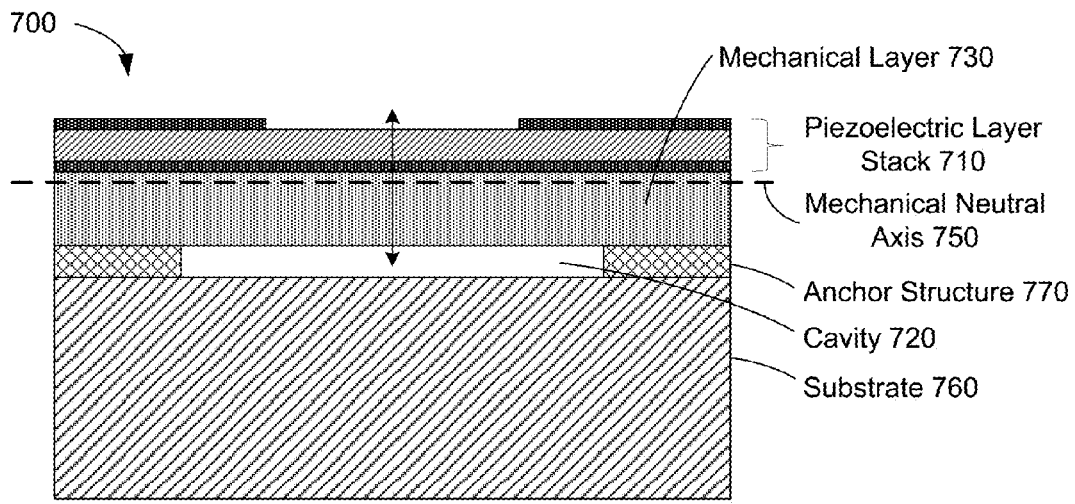
Figure 7E:
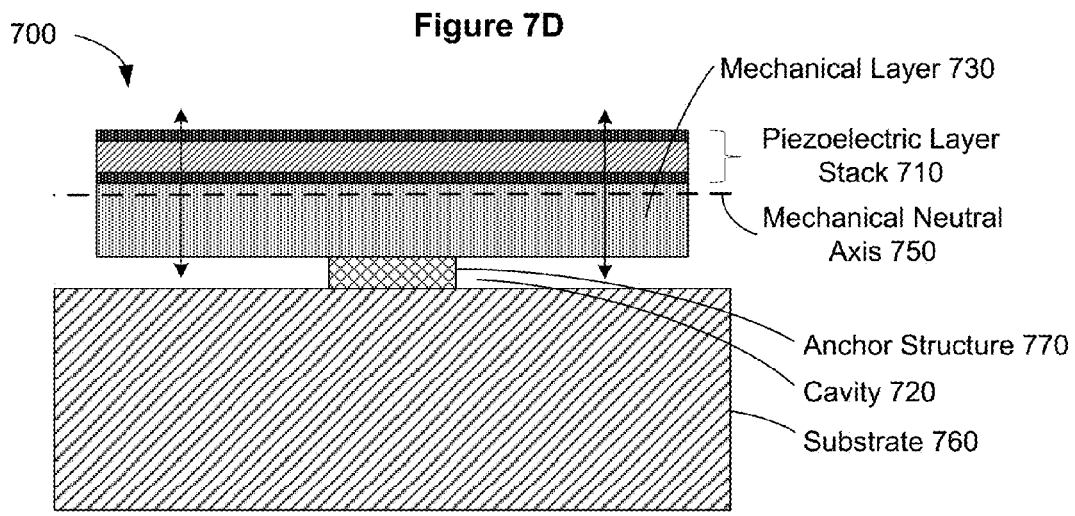
Figure 7F:
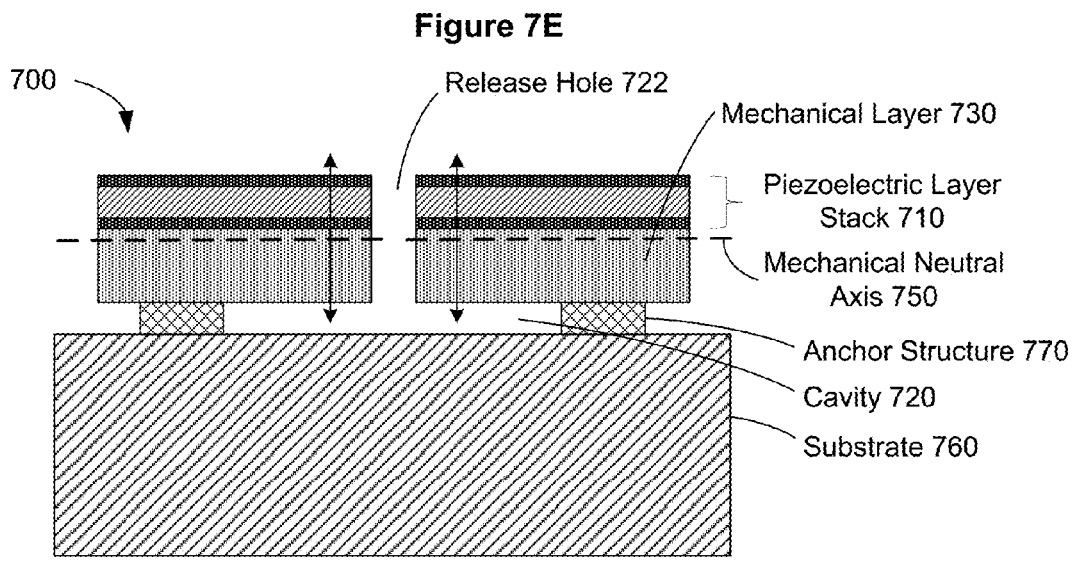

FIG. 7B shows a central anchor structure 770 positioned between the piezoelectric layer stack 710 and the substrate 760. FIG. 7C shows a variant of the peripheral anchor structure 770 with a central release hole 722. The configuration shown in FIG. 7C may alternatively represent a pair of cantilevered PMUTs 700. The dual vertical arrows in FIGS. 7A-7F represent one mode of operation, such as an out-of-plane bending mode, where the released portions of the PMUT 700 may be driven to oscillate or otherwise deflect in the directions indicated by the corresponding arrows. FIG. 7D shows a PMUT 700 with a peripheral anchor structure 770 positioned between a substrate 760 and the piezoelectric layer stack 710, with a mechanical layer 730 positioned between the piezoelectric layer stack 710 and the cavity 720. The mechanical neutral axis 750 of the multilayer stack may be displaced relative to the neutral axis of the piezoelectric layer stack 710 in a direction towards the underlying cavity 720 and substrate 760, to allow one or more out-of-plane bending modes. FIG. 7E shows a PMUT 700 with a central anchor structure 770 positioned between the piezoelectric layer stack 710 and the substrate 760, with a mechanical layer 730 positioned between the piezoelectric layer stack 710 and the cavity 720. Similar to the PMUT 700 in FIG. 7D, the mechanical neutral axis 750 of the multilayer stack may be displaced from the neutral axis of the piezoelectric layer stack 710 towards the cavity 720 and the substrate 760. FIG. 7F shows a PMUT 700 with a peripheral anchor structure 770 having a central release hole 722. Alternatively, the configuration shown in FIG. 7F may represent a pair of cantilevered PMUTs 700. The mechanical layer 730 is positioned between the piezoelectric layer stack 710 and the cavity 720. The mechanical neutral axis 750 of the multilayer stack may be displaced from the center of the piezoelectric layer stack 710 towards the underlying cavity 720 and substrate 760.

Figure 8A:
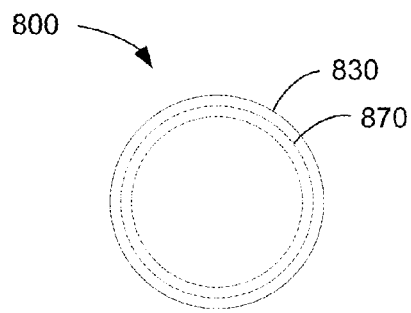
FIGS. 8A-8H show top views of various geometrical configurations of PMUTs and anchor structures.
Figure 8B:
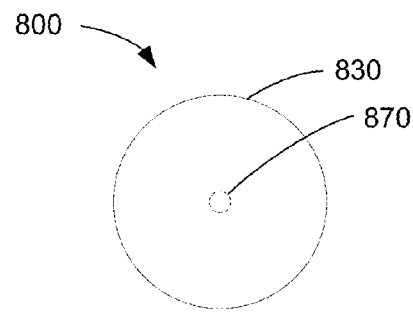
Figure 8C:
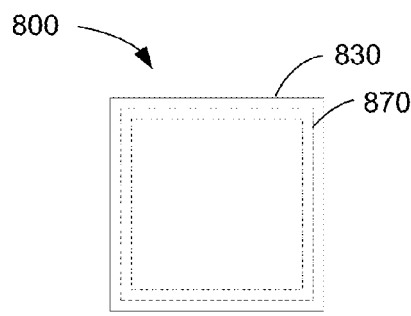
Figure 8D:
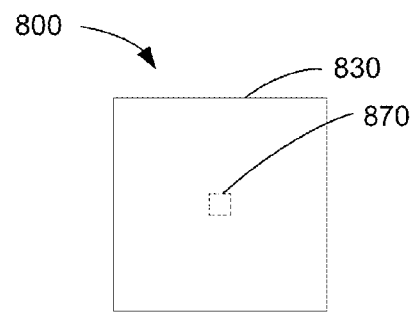
Figure 8E:
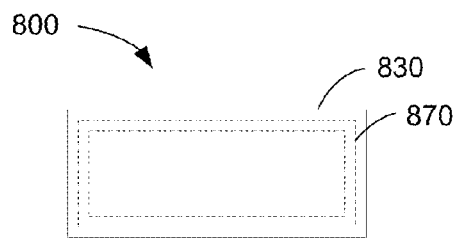
Figure 8F:
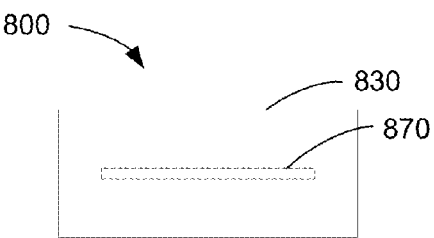
Figure 8G:
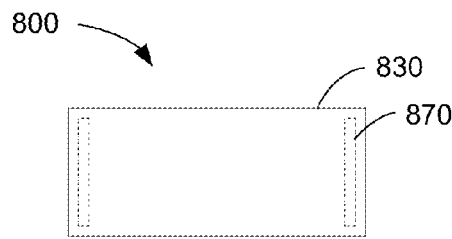
Figure 8H:
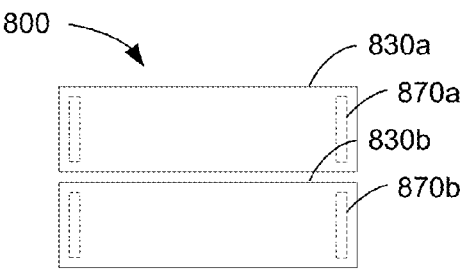

FIGS. 8A-8H show top views of various geometrical configurations of PMUTs and anchor structures. A circular PMUT 800 with a circular mechanical layer 830 and a peripheral anchor structure 870 is shown in FIG. 8A. A circular PMUT 800 with a circular mechanical layer 830 and a central anchor structure 870 is shown in FIG. 8B. FIGS. 8C and 8D show square PMUTs 800 with a peripheral anchor structure 870 and a central anchor structure 870, respectively. FIGS. 8E and 8F show long rectangular PMUTs 800 with a peripheral anchor structure 870 and a centered anchor structure 870, respectively. FIG. 8G shows a rectangular PMUT 800 with a pair of side anchor structures 870. FIG. 8H shows a pair of rectangular PMUTs 800 also referred to as ribbon PMUTs or PMUT strips with side anchor structures 870a and 870b. The PMUTs 800 shown in FIGS. 8A-8H are illustrative, with connective electrodes, pads, traces, etch holes and other features omitted for clarity. In some implementations, particularly those with central or otherwise centered anchor structures, the anchor structures may be referred to as anchor posts or simply "posts". The PMUTs shown in FIGS. 8A-8H may be configured with substantial portions of the mechanical layer positioned above the piezoelectric layer stack, as shown in FIG. 2A, or with substantial portions of the mechanical layer positioned below the piezoelectric layer stack, as shown in FIG. 2C.

The PMUTs described in this disclosure may in general be sealed or unsealed. Sealed PMUTs have at least a portion of an associated cavity sealed from the external environment. In some implementations, sealed PMUTs may have a vacuum sealed inside the cavity region. In some implementations, the sealed PMUTs may have a gas such as argon, nitrogen or air at a reference pressure within the cavity region that is below, above or substantially at atmospheric pressure. The acoustic performance of sealed PMUTs may exceed that of unsealed PMUTs, in that damping of the PMUT structure may be higher with unsealed PMUTs. In some implementations, unsealed PMUTs may be utilized. For example, PMUTs with a central anchor or post structure may be unsealed or otherwise considered to be an open structure. Unsealed PMUTs may allow liquid, gas, or other viscous medium to penetrate the cavity region. PMUTs with associated acoustic ports, for example, may be unsealed on one or both sides of the PMUT to allow the transmission and reception of acoustic or ultrasonic waves. One or more acoustic ports such as holes etched or otherwise formed in the substrate under the PMUT may be included with the various implementations of PMUTs and fabrication methods described above. In some implementations, an unsealed PMUT or an array of unsealed PMUTs may be covered with a cover layer that may serve as a top mechanical layer or a supplement to the top mechanical layer, such as the upper mechanical layer 530b shown in FIG. 5B. The cover layer may extend over one or more release holes associated with the PMUT(s) and attached to the PMUT membranes with, for example, an adhesive layer, to seal the PMUT cavities and provide isolation from ambient gases and liquids.

Figure 9:
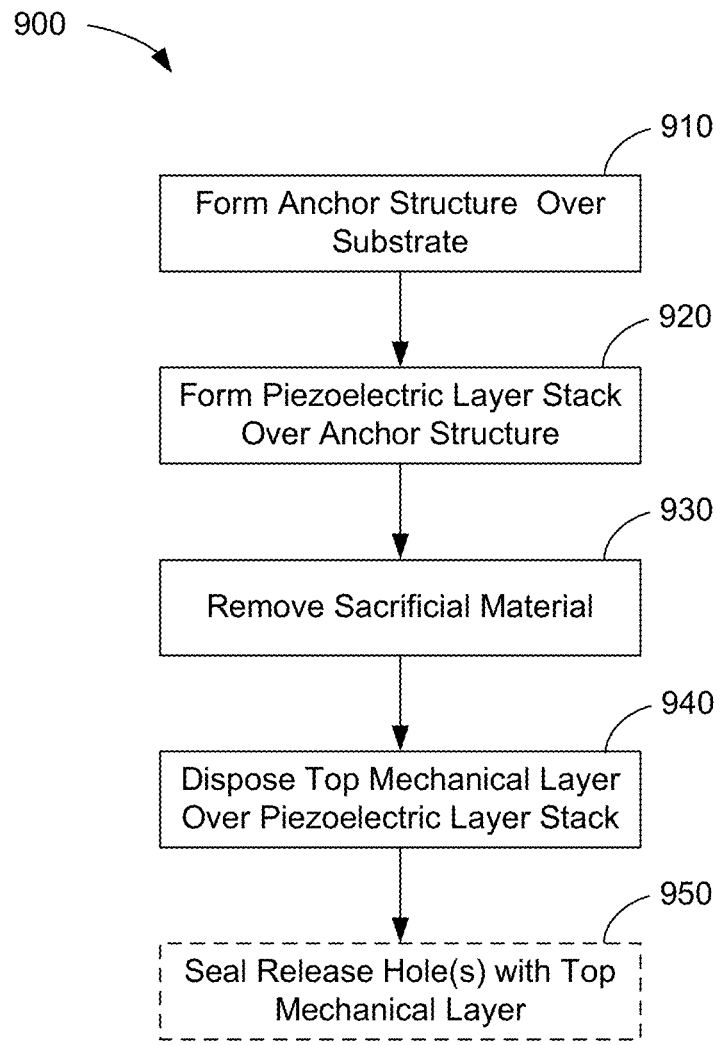
FIG. 9 illustrates a further example of a process flow for fabricating a PMUT.

FIG. 9 illustrates a further example of a process flow for fabricating a PMUT. Method 900 includes a step 910 for forming an anchor structure over a substrate. The substrate may include a glass substrate such as a glass plate, panel, sub-panel or wafer. In some implementations, the substrate may be plastic or may be flexible. The substrate may include TFT circuitry. Alternatively, the substrate may include a semiconductor substrate such as silicon wafer with or without prefabricated integrated circuitry. The anchor structure may include one or more layers of deposited dielectric materials such as silicon dioxide, silicon nitride, or silicon oxynitride. The anchor structure may include a silicide such as nickel silicide. The anchor structure may be disposed proximate to regions of sacrificial material patterned so as to allow for the eventual formation of one or more cavities, release holes, vias, and channels. The sacrificial material may include amorphous silicon (a-Si), polycrystalline silicon (poly-Si), or a combination of a-Si and poly-Si. A planarizing sequence such as CMP or chemical thinning may be used to planarize the anchor structure and the sacrificial layer.

In step 920, a piezoelectric layer stack is formed over the anchor structure. The piezoelectric layer stack may include a piezoelectric layer such as AN, ZnO or PZT with one or more electrode layers electrically coupled to the piezoelectric layer. The piezoelectric layer stack may be patterned and etched to form via or release holes and other features. In step 930, the sacrificial material is removed. Removing the sacrificial material may be achieved by removal of the sacrificial layer from a cavity region through release holes. In some implementations, removing the sacrificial material may be achieved by etching of the sacrificial layer through one or more release vias or holes and one or more release channels that may connect one or more outer release holes with the cavity region. In step 940, a mechanical layer is disposed over the piezoelectric layer stack, such that a neutral axis of the resulting assembly is located a distance towards the mechanical layer and away from the substrate so that the neutral axis passes through the mechanical layer and does not pass through the piezoelectric layer stack. In some implementations, the mechanical layer may be disposed over the piezoelectric layer stack with a thickness such that the neutral axis of the resulting multilayer stack is displaced relative to the neutral axis of the piezoelectric layer stack and towards the mechanical layer to allow out-of-plane bending modes. In some implementations, the mechanical layer may include a deposited layer, a composite of one or more layers, a bonded layer, or a bonded layer over a deposited layer or set of layers. The mechanical layer may be patterned to form features such as a top recess where the mechanical layer is locally thinned. As shown in step 950 and depending on the implementation, one or more release holes may be sealed when the mechanical layer is disposed over the piezoelectric layer stack.

Figure 10A:
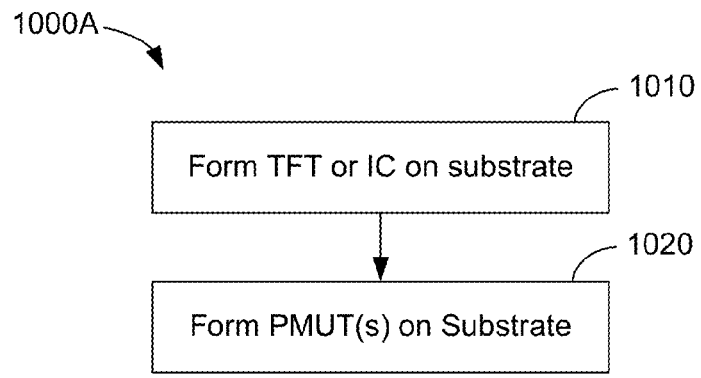
FIGS. 10A-10C illustrate process flows for integrating electronic circuitry with PMUTs as described above.
Figure 10B:
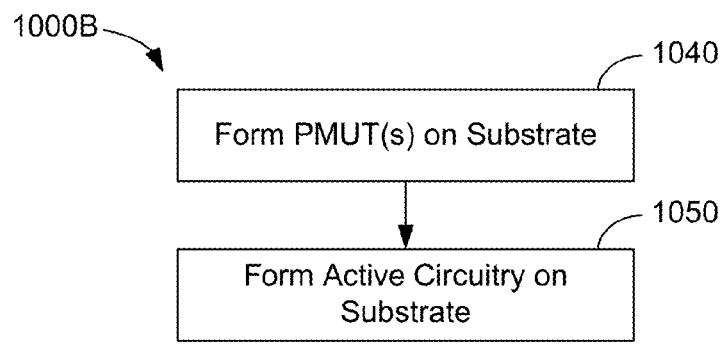
Figure 10C:
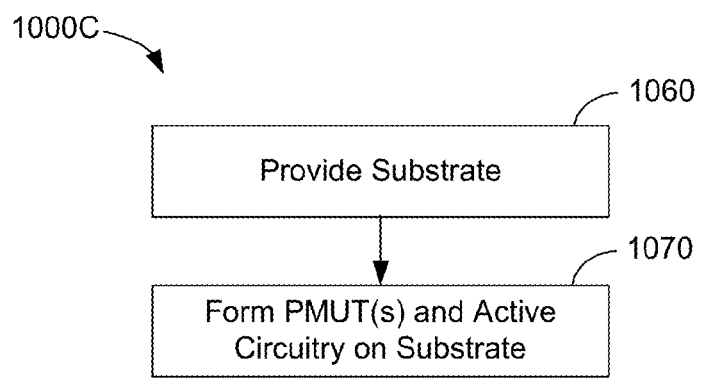

FIGS. 10A-10C illustrate process flows for integrating electronic circuitry with PMUTs as described above. FIG. 10A illustrates a "TFT first" process 1000a, where TFT or other integrated circuitry is formed on/in a substrate in step 1010, followed by formation of one or more PMUTs on the substrate that may be on top of or beside the circuitry, as shown in step 1020. This approach allows a first fabrication facility to form active circuitry on a substrate, and a second fabrication facility to receive the substrate with the active circuitry and form the PMUTs on the substrate. FIG. 10B illustrates a "TFT last" process 1000b, where TFT or other integrated circuitry is formed on/in a substrate after the PMUTs are formed, as shown in steps 1040 and 1050. Planarization steps and thick dielectric layers may serve to provide surfaces onto which TFT circuitry may be formed, as described above. FIG. 10C illustrates a combined or co-fabricated process 1000c where PMUTs and active circuitry are formed on a substrate, as shown in steps 1060 and 1070. This approach may benefit from utilizing common layers for both active circuitry and PMUT formation that can reduce the total number of masking and deposition steps required compared to a PMUT-first or PMUT-last process. For example, metal interconnect layers for TFT or silicon-based transistors may be used for the upper or lower electrode layers for the PMUTs. In another example, dielectric layers between metal layers for the active circuitry may be used for buffer or barrier layers in the PMUTs, or for use in the mechanical layer or for sealing. Etch sequences for metal or dielectric layers may be used in common to form portions of the active circuitry and the PMUTs on the substrate. In another example, passivation layers for the TFT or active circuitry may be used for passivation of the PMUT devices. In some implementations, the TFT or active circuitry may include row and column addressing electronics, multiplexers, local amplification stages or control circuitry. In some implementations, an interface circuit including a driver stage and a sense stage may be used to excite a PMUT device and detect responses from the same or another PMUT device. In some implementations, the active silicon circuits may include electronics for the functioning of the PMUT or a PMUT array.

Figure 11A:
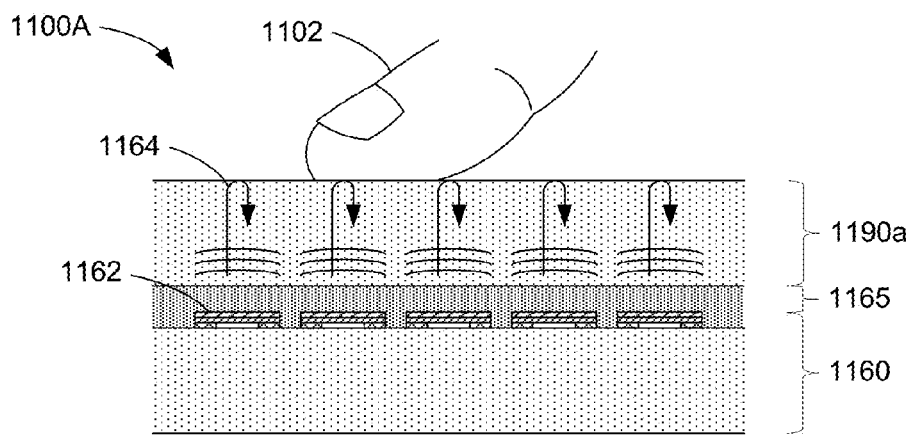
FIGS. 11A-11C illustrate cross-sectional views of various configurations of PMUT ultrasonic sensor arrays.
Figure 11B:
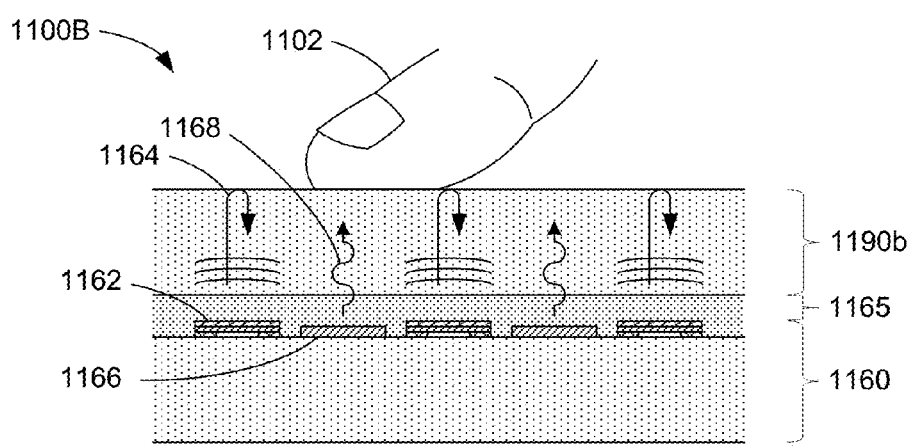
Figure 11C:
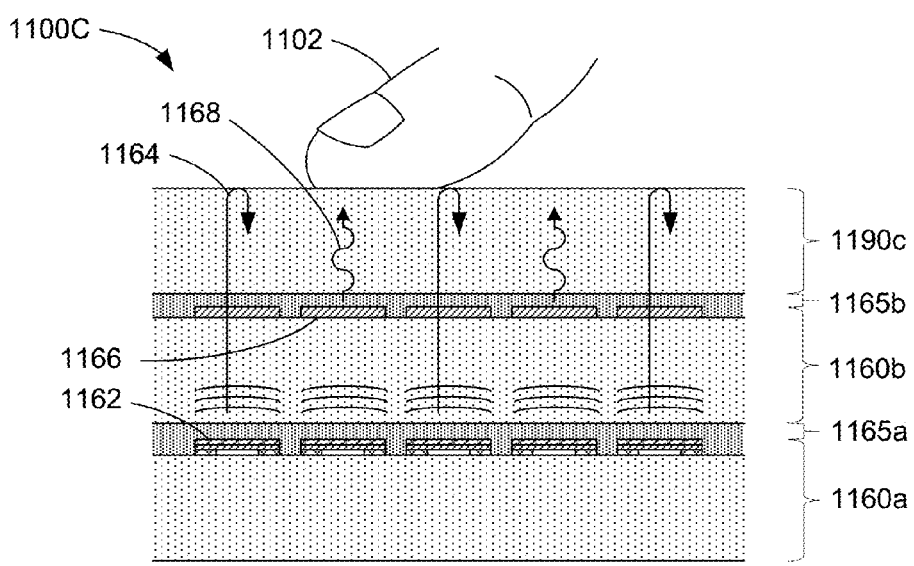

FIGS. 11A-11C illustrate cross-sectional views of various configurations of PMUT ultrasonic sensor arrays. FIG. 11A depicts an ultrasonic sensor array 1100A with PMUTs as transmitting and receiving elements that may be used, for example, as an ultrasonic fingerprint sensor, an ultrasonic touchpad, or an ultrasonic imager. PMUT sensor elements 1162 on PMUT sensor array substrate 1160 may emit and detect ultrasonic waves. As illustrated, an ultrasonic wave 1164 may be transmitted from a PMUT sensor element 1162. The ultrasonic wave 1164 may travel through an acoustic coupling medium 1165 and a platen 1190a towards an object 1102 such as a finger or a stylus positioned on an outer surface of the platen 1190a. A portion of the outgoing ultrasonic wave 1164 may be transmitted through the platen 1190a and into the object 1102, while a second portion is reflected from a surface of platen 1190a back towards the sensor element 1162. The amplitude of the reflected wave depends in part on the acoustic properties of the object 1102. The reflected wave may be detected by the sensor element 1162, from which an image of the object 1102 may be acquired. For example, with sensor arrays having a pitch of about 50 microns (about 500 pixels per inch), ridges and valleys of a fingerprint may be detected. An acoustic coupling medium 1165 such as an adhesive, gel, a compliant layer or other acoustic coupling material may be provided to improve coupling between an array of PMUT sensor elements 1162 disposed on the sensor array substrate 1160 and the platen 1190a. The acoustic coupling medium 1165 may aid in the transmission of ultrasonic waves to and from the sensor elements 1162. The platen 1190a may include, for example, a layer of glass, plastic, sapphire, or other platen material. An acoustic impedance matching layer (not shown) may be disposed on an outer surface of the platen 1190a.

FIG. 11B depicts an ultrasonic sensor and display array 1100B with PMUT sensor elements 1162 and display pixels 1166 co-fabricated on a sensor and display substrate 1160. The sensor elements 1162 and display pixels 1166 may be collocated in each cell of an array of cells. In some implementations, the sensor element 1162 and the display pixel 1166 may be fabricated side-by-side within the same cell. In some implementations, part or all of the sensor element 1162 may be fabricated above or below the display pixel 1166. Platen 1190b may be positioned over the sensor elements 1162 and the display pixels 1166 and may function as or include a cover lens or cover glass. The cover glass may include one or more layers of materials such as glass, plastic or sapphire, and may include provisions for a capacitive touchscreen. An acoustic impedance matching layer (not shown) may be disposed on an outer surface of the platen 1190b. Ultrasonic waves 1164 may be transmitted and received from one or more sensor elements 1162 to provide imaging capability for an object 1102 such as a stylus or a finger placed on the cover glass 1190b. The cover glass 1190b is substantially transparent to allow optical light from the array of display pixels 1166 to be viewed by a user through the cover glass 1190b. The user may choose to touch a portion of the cover glass 1190b, and that touch may be detected by the ultrasonic sensor array. Biometric information such as fingerprint information may be acquired, for example, when a user touches the surface of the cover glass 1190b. An acoustic coupling medium 1165 such as an adhesive, gel, or other acoustic coupling material may be provided to improve acoustic, optical and mechanical coupling between the sensor array substrate 1160 and the cover glass. In some implementations, the coupling medium 1165 may be a liquid crystal material that may serve as part of a liquid crystal display (LCD). In LCD implementations, a backlight (not shown) may be optically coupled to the sensor and display substrate 1160. In some implementations, the display pixels 1166 may be part of an amorphous light-emitting diode (AMOLED) display with light-emitting display pixels. In some implementations, the ultrasonic sensor and display array 1100B may be used for display purposes and for touch, stylus or fingerprint detection.

FIG. 11C depicts an ultrasonic sensor and display array 1100C with a sensor array substrate 1160a positioned behind a display array substrate 1160b. An acoustic coupling medium 1165a may be used to acoustically couple the sensor array substrate 1160a to the display array substrate 1160b. An optical and acoustic coupling medium 1165b may be used to optically and acoustically couple the sensor array substrate 1160a and the display array substrate 1160b to a cover lens or cover glass 1190c, which may also serve as a platen for the detection of fingerprints. An acoustic impedance matching layer (not shown) may be disposed on an outer surface of the platen 1190c. Ultrasonic waves 1164 transmitted from one or more sensor elements 1162 may travel through the display array substrate 1160*b* and cover glass 1190*c*, reflect from an outer surface of the cover glass 1190*c*, and travel back towards the sensor array substrate 1160*a* where the reflected ultrasonic waves may be detected and image information acquired. In some implementations, the ultrasonic sensor and display array 1100C may be used for providing visual information to a user and for touch, stylus or fingerprint detection from the user. Alternatively, a PMUT sensor array may be formed on the backside of the display array substrate 1160*b*. Alternatively, the sensor array substrate 1160*a* with a PMUT sensor array may be attached to the backside of the display array substrate 1160*b*, with the backside of the sensor array substrate 1160*a* attached directly to the backside of the display array substrate 1160*b*, for example, with an adhesive layer or adhesive material (not shown).

As described above in connection with FIGS. 4A and 4B, a process flow for forming a PMUT stack according to the presently disclosed techniques may include a sequence of microfabrication processes, including deposition, patterning, etching and CMP. In addition to the process flow illustrated in FIGS. 4A and 4B, a number of alternative process flows are within the contemplation of the present disclosure.

Figure 12:
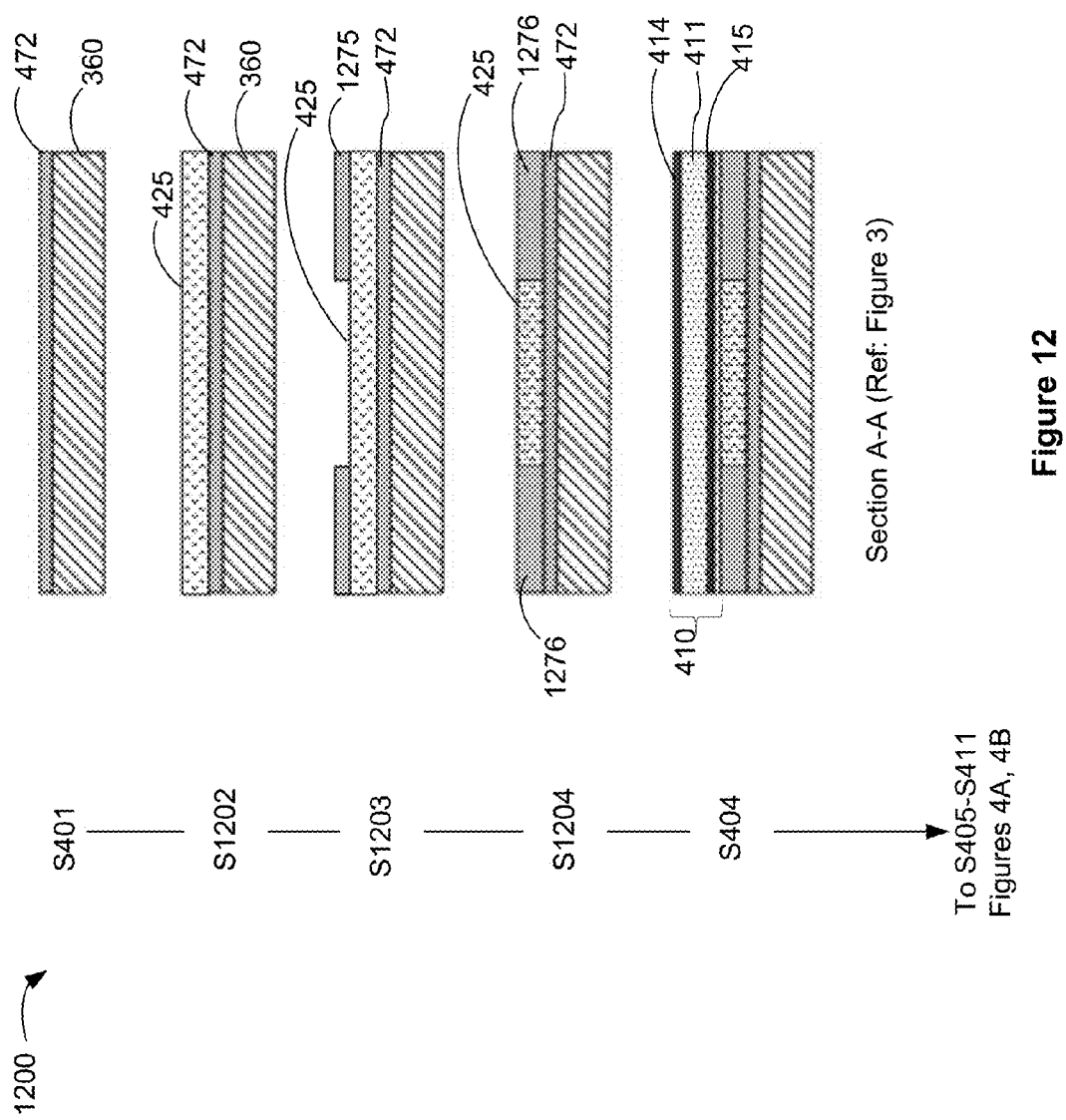
FIG. 12 illustrates another example of a process flow for fabricating a PMUT.

FIG. 12 illustrates another example of a process flow for fabricating a PMUT. In the illustrated example, a process 1200 incorporates a silicide formation process that can planarize the top of the anchor structure and the top of the sacrificial layer. As a result, a CMP sequence included in step S403 (FIG. 4A) may be avoided. The silicide may form at least a portion of the anchor structure for the PMUT, and serve as an etch-resistant layer during removal of the sacrificial material to form the PMUT cavity.

The process 1200 may begin with step S401. Step S401, as described hereinabove in connection with FIG. 4A, may include depositing a first layer portion 472 of anchor structure 470 onto substrate 360.

At step S1202, sacrificial regions 425*i* and 425*o* (FIG. 4A) are formed by first depositing a sacrificial layer 425 of a sacrificial material that may include amorphous silicon (a-Si), polycrystalline silicon (poly-Si), or a combination of a-Si and poly-Si onto the oxide buffer layer 472. Alternatively, other sacrificial layer materials may be used such as molybdenum (Mo) or tungsten (W). In some implementations, the sacrificial layer 425 has a thickness in the range of about 500 to 20,000 Å. For example, in an implementation the thickness of the sacrificial layer 425 is about 10,000 Å.

At step S1203 a nickel layer 1275 may be deposited onto the sacrificial layer 425. The nickel layer 1275 may have a thickness in a range of about 250 to 10,000 Å. For example, in an implementation the thickness of the nickel layer 1275 is about 5000 Å. Step S1203 may also include patterning and etching the nickel layer 1275 so as to expose the sacrificial layer 425 in selected regions.

At step S1204, a silicide formation process is contemplated whereby a layer of metal such as nickel may be deposited and patterned on top of the sacrificial layer 425 of polycrystalline or amorphous silicon. The silicide may be formed by interacting the metal with the silicon of the sacrificial layer 425. Nickel silicide may be formed, for example, by interacting the patterned nickel layer 1275 with the silicon of the sacrificial layer 425. Formation of silicide in portions 1276 of the sacrificial layer 425 may be achieved by diffusing the metal locally into the sacrificial layer, consuming the deposited metal and forming the silicide down to an underlying buffer layer (such as SiO2 or SiN on a silicon substrate) or down to an insulating substrate (such as glass). Metal diffusion into the underlying sacrificial layer can be achieved, for example, by elevating the process temperature of the substrate and deposited layers to a silicide formation temperature for a predetermined period of time. Alternatively, a rapid thermal anneal (RTA) process may be used to quickly elevate the temperature to allow intermetallic diffusion and silicide formation. Alternatively, application of focused laser light of a suitable wavelength, energy and time may be used to locally form the silicide, which may be particularly attractive with the use of transparent substrates where the laser light may be applied from either above or below the substrate.

Subsequent steps of the process 1200 may be substantially identical to steps S404 through S411 described hereinabove in connection with FIGS. 4A and 4B.

Figure 13A:
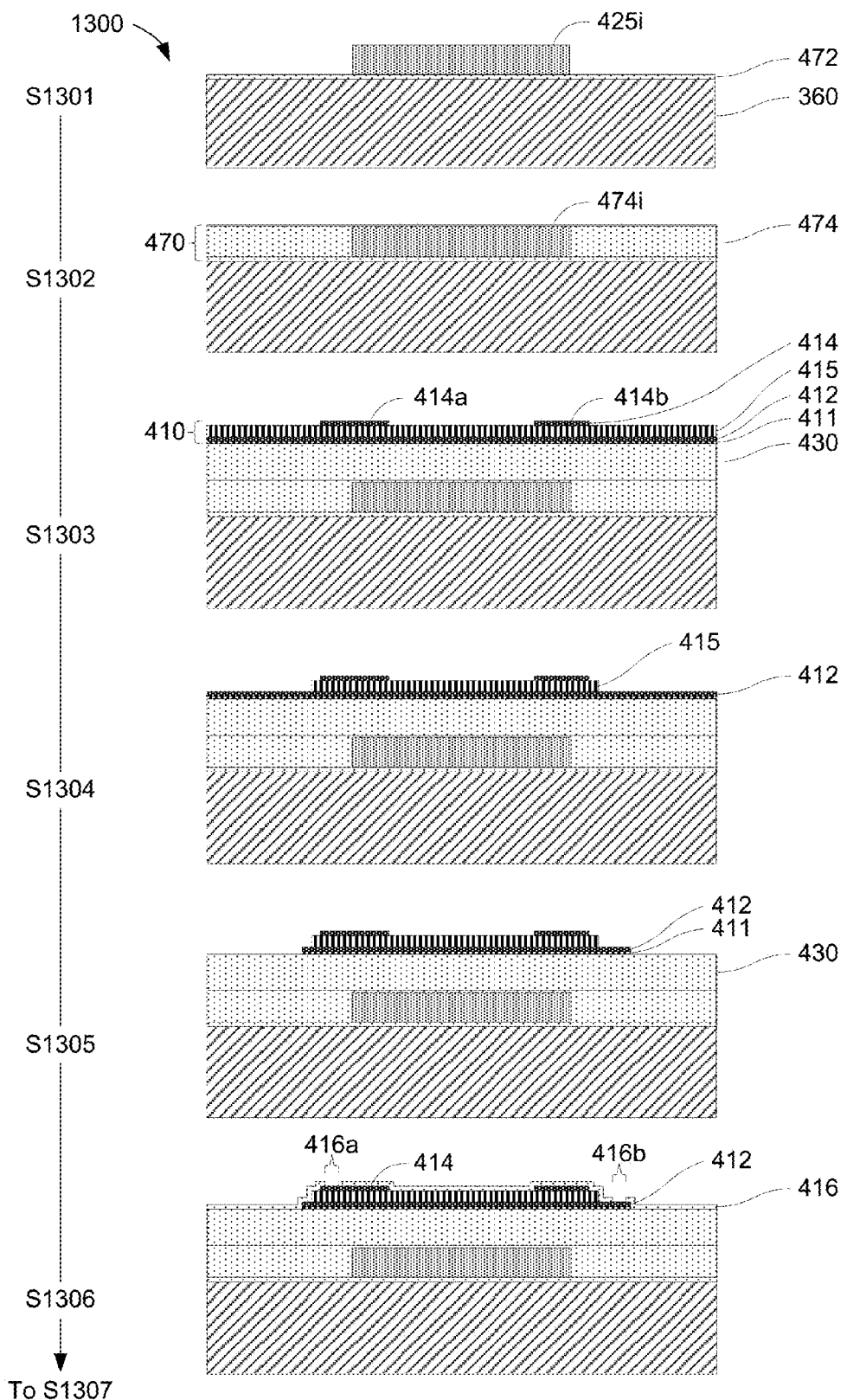
FIGS. 13A and 13B illustrate another example of a process flow for fabricating a PMUT.
Figure 13B:
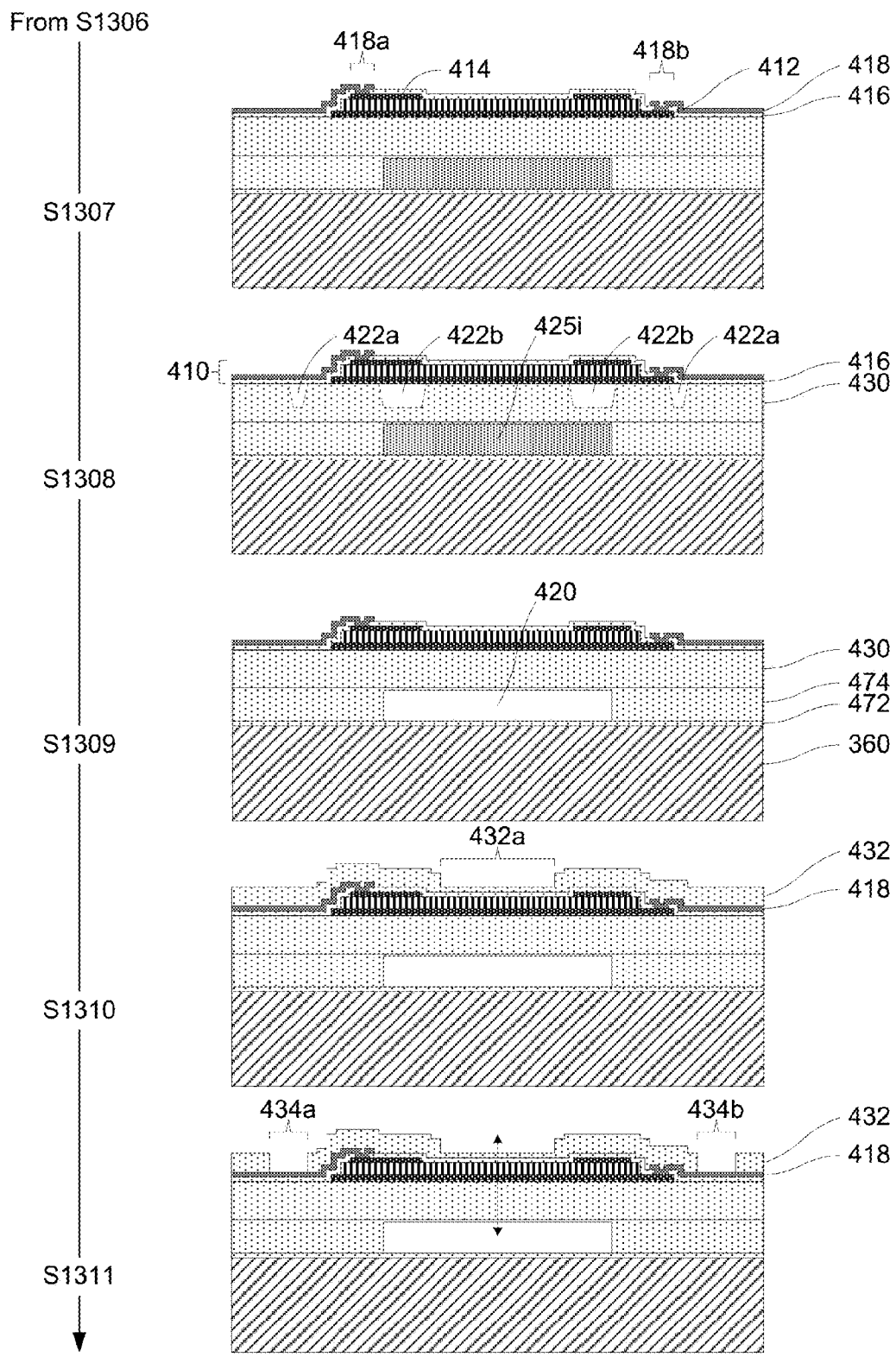

FIGS. 13A and 13B illustrate another example of a process flow for fabricating a PMUT. Process flow 1300 provides three layers of metal interconnections for a PMUT with a mechanical layer positioned substantially between the piezoelectric layer stack and the underlying substrate. In a first step S1301, a substrate 360 is provided, such as a glass, plastic or semiconductor (e.g. silicon) substrate upon which to fabricate the PMUTs. A first layer portion 472, such as an oxide buffer layer, may be deposited on the substrate 360. A sacrificial layer 425 of a sacrificial material may be deposited on the buffer layer. The sacrificial layer 425 may be patterned and etched to form one or more inner sacrificial regions 425*i* and outer sacrificial regions 425*o* (not shown), with the etchant stopping on the underlying buffer layer or substrate. In step S1302, an anchor portion 474 of the anchor structure 470 such as a silicon dioxide layer may be deposited onto the buffer layer and the sacrificial region 425*i*, then thinned using CMP to form a substantially planar surface while retaining a small portion 474*i* of the silicon dioxide layer above the sacrificial region 425*i*. In step S1303, a multilayer stack may be deposited including a mechanical layer 430, a first layer 411 of the piezoelectric stack 410 that may serve as a seed layer, a lower electrode layer 412, a piezoelectric layer 415, and an upper electrode layer 414. The upper electrode layer may be patterned and etched to form upper electrodes 414*a* and 414*b* that are in electrical contact with the piezoelectric layer 415. In step S1304, the piezoelectric layer 415 may be patterned and etched, stopping on the lower electrode layer 412. In step S1305, the lower electrode layer 412 may be patterned and etched along with the underlying seed layer 411, stopping on the mechanical layer 430. In step S1306, a dielectric isolation layer 416 may be deposited, patterned and etched to form electrical vias 416*a* and 416*b* that expose portions of the upper electrode layer 414 and lower electrode layer 412, respectively.

Process flow 1300 continues in FIG. 13B with the deposition, patterning and etching of a metal interconnect layer 418 in step S1307. The metal interconnect layer 418 may provide electrical traces and electrical contact 418*a* to portions of upper electrode layer 414 and electrical contact 418*b* to portions of lower electrode layer 412 through electrical vias 416*a* and 416*b*, respectively.

In step S1308, one or more recesses 422 may be formed in the mechanical layer 430. For example, recesses 422*a* may be formed external to the PMUT membrane to provide mechanical isolation or to increase sensitivity. Recesses 422*b* may be formed internal to the PMUT membrane to increase sensitivity, for example, by allowing the PMUT membrane to flex or vibrate with a larger mechanical amplitude relative to a planar PMUT membrane. The recesses 422 may include substantially axisymmetric features such as a circle or a ring formed partially into a circular PMUT diaphragm near the diaphragm center, or an angular trench or portions of an angular trench formed near the periphery of a circular diaphragm. In some implementations, the recesses 422 may include a square or rectangular feature formed into the mechanical layer 430 near the center of a square or rectangular PMUT diaphragm. In some implementations, the recesses 422 may include features such as narrow rectangles, local trenches, or slots formed near the periphery of or external to a square, rectangular or circular diaphragm. In some implementations, a sequence of radial slots may be combined with central or peripheral recess features. In some implementations, the recess or recessed features may be formed by etching partially or substantially through the mechanical layer 430. In some implementations, the recess 422 and/or features thereof may be formed into the mechanical layer 430 based, for example, on an etch time. In some implementations, the mechanical layer 430 may include two or more deposited layers, one of which may serve as an etch stop or barrier layer to allow precise definition of the recess 422 and recessed features during fabrication. The formation of recesses 422 is optional, and associated process sequences may be omitted accordingly. Dashed lines in step S1308 for recesses 422a and 422b indicate that their positions, when used, may be formed under etched portions of the piezoelectric layer stack 410 such as where first layer 411, lower electrode layer 412, piezoelectric layer 415, upper electrode layer 414, dielectric isolation layer 416 and metal interconnect layer 418 have been removed.

In step S1309, portions of mechanical layer 430 and other layers may be patterned and etched to provide access (not shown) to sacrificial regions 425i and 425o, which allows the selective removal of exposed sacrificial material in the sacrificial layer 425, resulting in the formation of one or more cavities 420. More details of release holes, release channels, and the sacrificial etching process may be found with respect to FIG. 4A-B above (not shown here for clarity). Implementations with thermally decomposable sacrificial materials may not require direct access to cavities 420 through release holes and release channels, as described with respect to FIG. 4A-B above.

In step S1310, a passivation layer 432 may be deposited over the interconnect layer 418 and exposed portions of the lower electrode layer 412 and upper electrode layer 414. Optionally, one or more upper recesses 432a may be formed in the passivation layer 432. For example, recesses 432a may be formed external to the PMUT membrane to provide mechanical isolation or to increase sensitivity. Recesses 432a may be formed internal to the PMUT membrane to increase sensitivity, for example, by allowing the PMUT membrane to flex or vibrate with a larger mechanical amplitude relative to a planar PMUT membrane. The recesses 432a may include substantially axisymmetric features such as a circle or a ring formed partially into a circular PMUT diaphragm near the diaphragm center, or an angular trench or portions of an angular trench formed near the periphery of a circular diaphragm. In some implementations, the recesses 432a may include a square or rectangular feature formed into the passivation layer 432 near the center of a square or rectangular PMUT diaphragm. In some implementations, the recesses 432a may include features such as narrow rectangles, local trenches, or slots formed near the periphery of or external to a square, rectangular or circular diaphragm. In some implementations, a sequence of radial slots may be combined with central or peripheral recess features. In some implementations, the recess or recessed features may be formed by etching partially or substantially through the passivation layer 432. In some implementations, the recess 432a and/or features thereof may be formed into the passivation layer 432 based on, for example, an etch time. In some implementations, the passivation layer 432 may include two or more deposited layers, one of which may serve as an etch stop or barrier layer to allow precise definition of the recess 432a and other recessed features during fabrication. The formation of recesses 432a is optional, and associated process sequences may be omitted accordingly. In step S1311, one or more contact pad openings or vias 434a and 434b may be patterned and etched through the passivation layer 432 to provide access to underlying metal features such as bond pads.

Figure 14A:
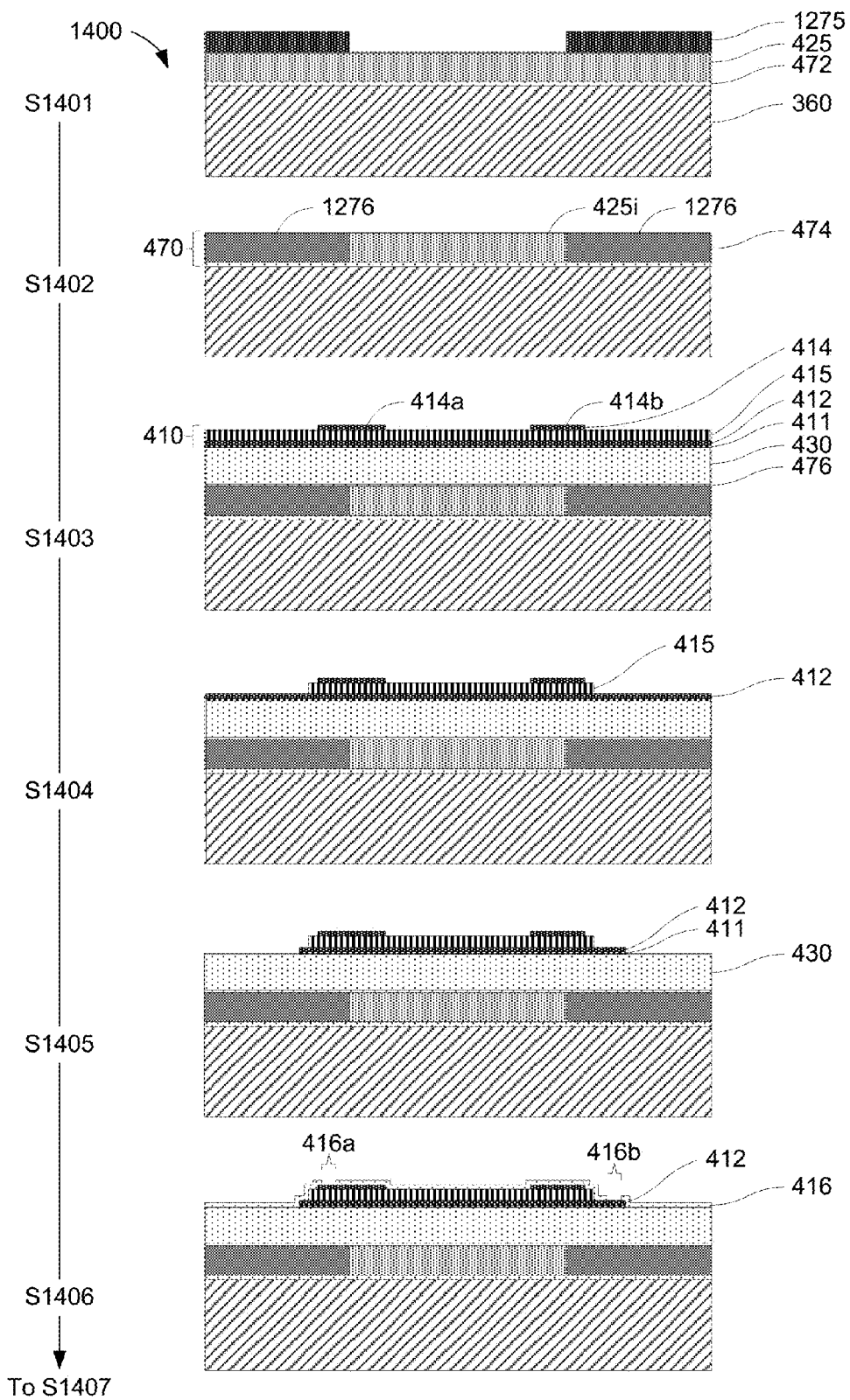
FIGS. 14A and 14B illustrate another example of a process flow for fabricating a PMUT.
Figure 14B:
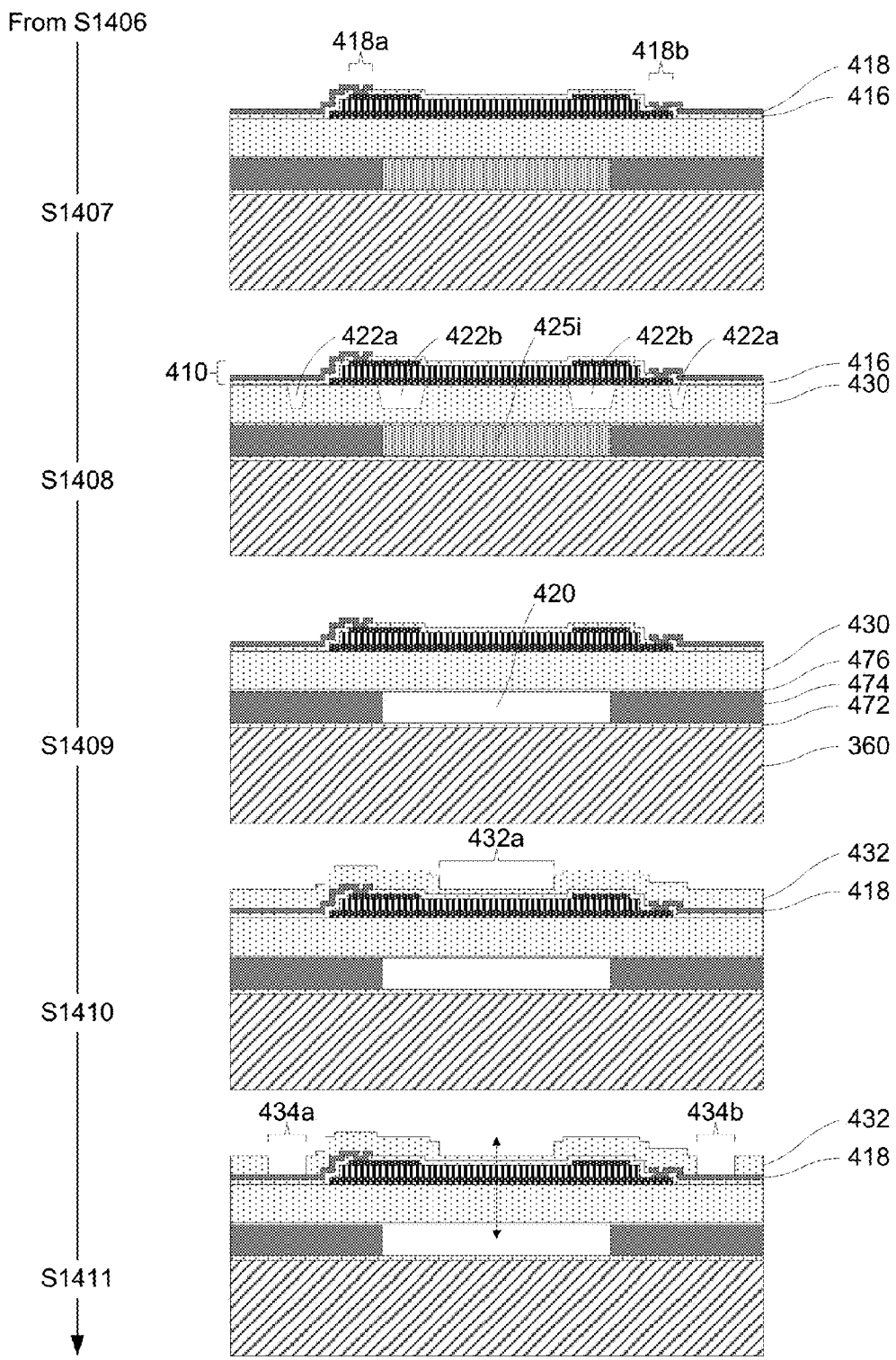

FIGS. 14A and 14B illustrate another example of a process flow for fabricating a PMUT. Process flow 1400 provides three layers of metal interconnections for a PMUT with a mechanical layer positioned substantially between the piezoelectric layer stack and the underlying substrate, utilizing a silicide-based planarization method as described above with respect to steps S1202-S1204 of FIG. 12. In step S1401, a substrate 360 is provided upon which to fabricate the PMUTs. A first layer portion 472, such as an oxide buffer or barrier layer, may be deposited on the substrate 360. A sacrificial layer 425 of amorphous or polycrystalline silicon may be deposited on the buffer layer, followed by the deposition of a metal layer such as a nickel layer 1275. The nickel layer 425 may be patterned and etched to expose one or more inner sacrificial regions 425i and outer sacrificial regions 425o (not shown), with the etchant stopping on the sacrificial layer 425. In step S1402, the nickel layer 1275 and underlying sacrificial layer 425 may be reacted in a high-temperature environment to locally form a silicide layer 1276 such as nickel silicide. Portions of the silicide layer 1276 may form an anchor portion 474 of the anchor structure 470. In step S1403, a multilayer stack may be deposited, including a thin barrier layer 476, a mechanical layer 430, a first layer 411 of the piezoelectric stack 410 that may serve as a seed layer, a lower electrode layer 412, a piezoelectric layer 415, and an upper electrode layer 414. The upper electrode layer 414 may be patterned and etched to form upper electrodes 414a and 414b that are in electrical contact with the piezoelectric layer 415. In step S1404, the piezoelectric layer 415 may be patterned and etched, stopping on the lower electrode layer 412. In step S1405, the lower electrode layer 412 may be patterned and etched along with the underlying seed layer 411, stopping on the mechanical layer 430. In step S1406, a dielectric isolation layer 416 may be deposited, patterned and etched to form electrical vias 416a and 416b that expose portions of the upper electrode layer 414 and lower electrode layer 412, respectively.

Process flow 1400 continues in FIG. 14B with the deposition, patterning and etching of a metal interconnect layer 418 in step S1407. The metal interconnect layer 418 may provide electrical traces and electrical contact 418a to portions of upper electrode layer 414 and electrical contact 418b to portions of lower electrode layer 412 through electrical vias 416a and 416b, respectively. In step S1408, one or more recesses 422 may be optionally formed in mechanical layer 430. Dashed lines in FIG. 14B for recesses 422a and 422b indicate that their positions, when used, may be formed in regions not directly under non-etched portions of the piezoelectric layer stack 410. In step S1409, portions of the mechanical layer 430 and other layers may be patterned and etched (not shown) to provide access to sacrificial regions 425i and 425o. Selective removal of exposed sacrificial material in the sacrificial layer 425 results in the formation of one or more cavities 420. More details of release holes, release channels, and the sacrificial etching process may be found with respect to FIG. 4A-B above. Implementations with thermally decomposable sacrificial materials may not require direct access to cavities 420 through release holes and release channels, as described with respect to FIG. 4A-B. In step S1410, a passivation layer 432 may be deposited over the interconnect layer 418 and exposed portions of the lower electrode layer 412 and upper electrode layer 414. Optionally, one or more upper recesses 432a may be formed in the passivation layer 432. In step S1411, one or more contact pad openings or vias 434a and 434b may be patterned and etched through the passivation layer 432 to provide access to underlying metal features such as bond pads in metal interconnect layer 418.

Figure 15A:
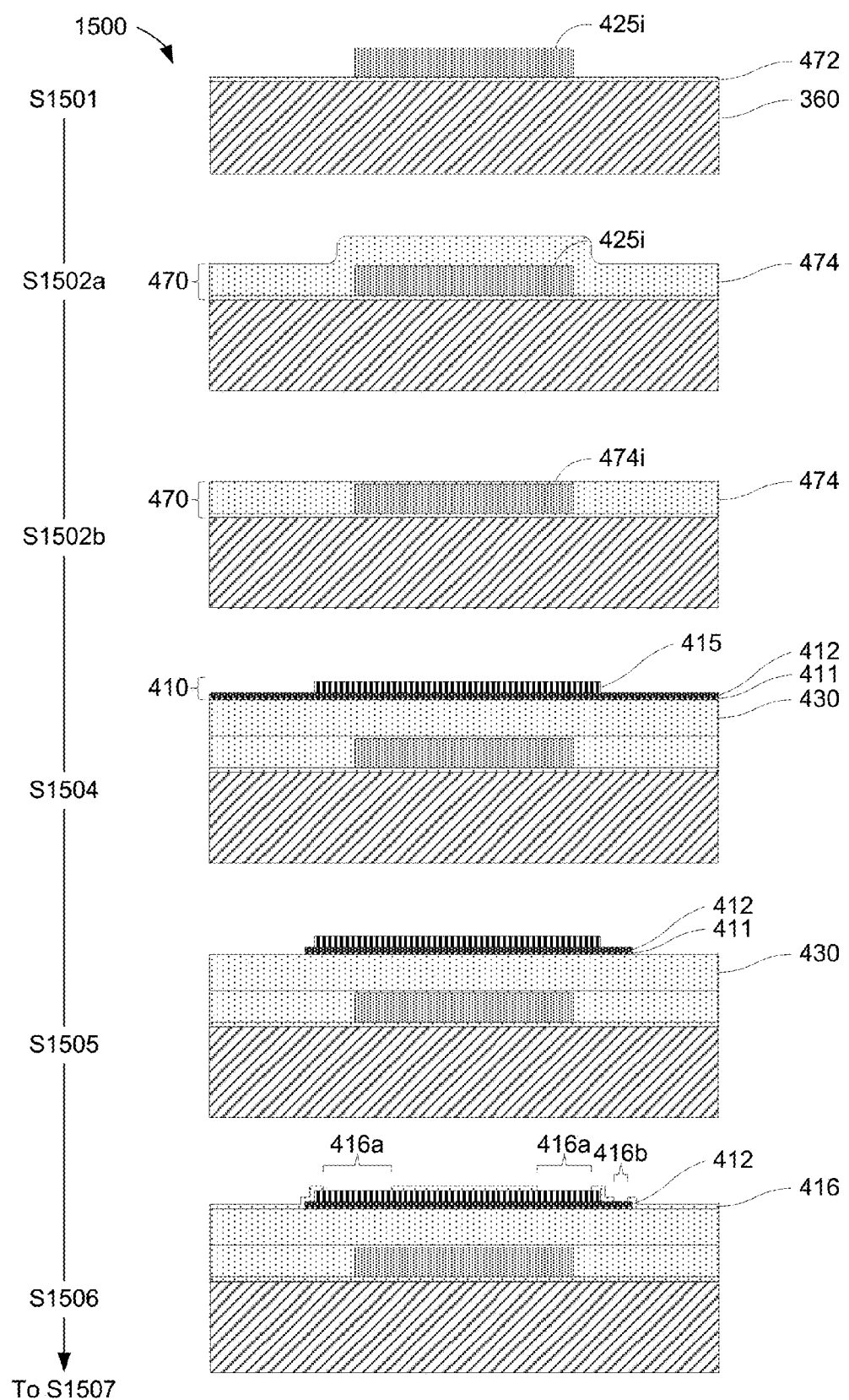
FIGS. 15A and 15B illustrate another example of a process flow for fabricating a PMUT.
Figure 15B:
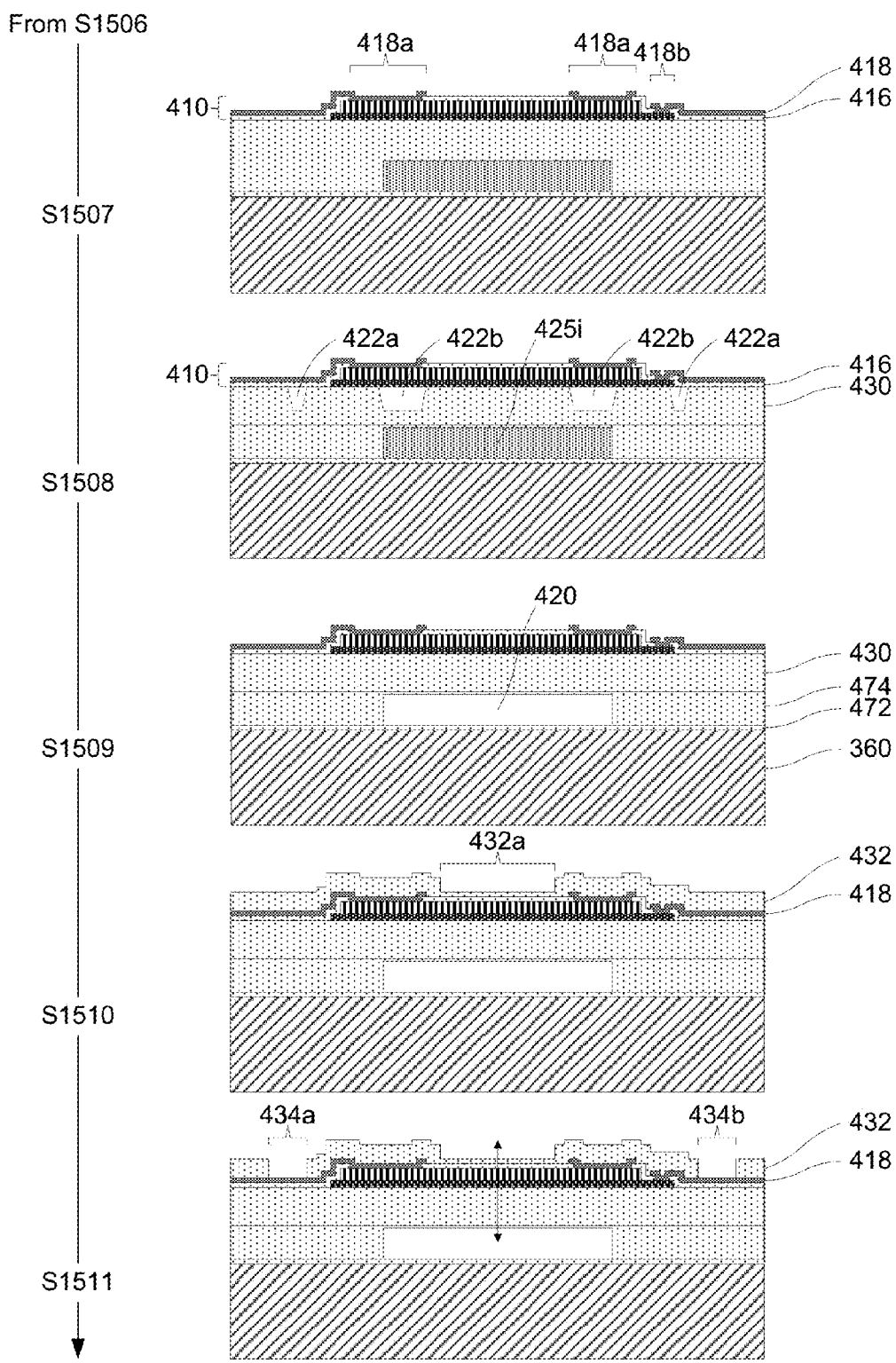

FIGS. 15A and 15B illustrate another example of a process flow for fabricating a PMUT. Process flow 1500 utilizes two layers of metal interconnections for a PMUT with a mechanical layer positioned substantially between the piezoelectric layer stack and the underlying substrate. In a first step S1501, a substrate 360 is provided upon which to fabricate the PMUTs. A first layer portion 472, such as an oxide buffer layer, may be deposited on the substrate 360. A sacrificial layer 425 of a sacrificial material may be deposited on the buffer layer. The sacrificial layer 425 may be patterned and etched to form one or more inner sacrificial regions 425i and outer sacrificial regions 425o (not shown), with the etchant stopping on the underlying buffer layer or substrate. In step S1502a, an anchor portion 474 of the anchor structure 470 may be deposited onto the buffer layer and the sacrificial regions, then thinned using CMP to form a substantially planar surface while retaining a small portion 474i above the sacrificial region as shown in step S1502b. In step S1504, a multilayer stack may be deposited, including a mechanical layer 430, a first layer 411 of the piezoelectric stack 410 that may serve as a seed layer, a lower electrode layer 412, and a piezoelectric layer 415. The piezoelectric layer 415 may be patterned and etched, stopping on the lower electrode layer 412. In step S1505, the lower electrode layer 412 and the underlying seed layer 411 may be patterned and etched, stopping on the mechanical layer 430. In step S1506, a dielectric isolation layer 416 may be deposited, patterned and etched to form electrical vias 416a and 416b that expose portions of the piezoelectric layer 415 and lower electrode layer 412, respectively. Alternatively, electrical coupling between the upper electrode layer 414 and underlying portions of the piezoelectric layer 415 may be achieved capacitively through the dielectric isolation layer 416, allowing excitation and detection of ultrasonic waves from flexural motions and vibrations of piezoelectric layer 415 without direct electrical contact, as described with respect to step S1507 below. In this implementation, one or more electrical vias 416a may be omitted and the dielectric isolation layer 416 would not be etched in the via region (not shown).

Process flow 1500 continues in FIG. 15B with the deposition, patterning and etching of a metal interconnect layer 418 in step S1507. The metal interconnect layer 418 may provide electrical traces and electrical contacts 418a to portions of piezoelectric layer 415 and electrical contact 418b to portions of lower electrode layer 412 through electrical vias 416a and 416b, respectively. In the capacitive coupling implementation described with respect to step S1506, the metal interconnect layer 418 may be dielectrically isolated from the piezoelectric layer 415 and one or more electrical vias 416a omitted. In step S1508, one or more recesses 422 may be formed in the mechanical layer 430. Dashed lines in step S1508 for recesses 422a and 422b indicate that their positions, when used, may be formed under etched portions of the piezoelectric layer stack 410. In step S1509, portions of mechanical layer 430 and other layers may be patterned and etched to provide access (not shown) to sacrificial regions 425i, which allows the selective removal of exposed sacrificial material in the sacrificial layer 425, resulting in the formation of one or more cavities 420. In some implementations with thermally decomposable sacrificial materials, direct access to cavities 420 through release holes and release channels may not be required, as described with respect to FIG. 4A-B above. In step S1510, the passivation layer 432 may be deposited over the interconnect layer 418 and exposed portions of the lower electrode layer 412 and upper electrode layer 414. Optionally, one or more upper recesses 432a may be formed in the passivation layer 432. In step S1511, one or more contact pad openings or vias 434a and 434b may be patterned and etched through the passivation layer 432 to provide access to underlying metal features such as bond pads in metal interconnect layer 418.

Figure 16A:
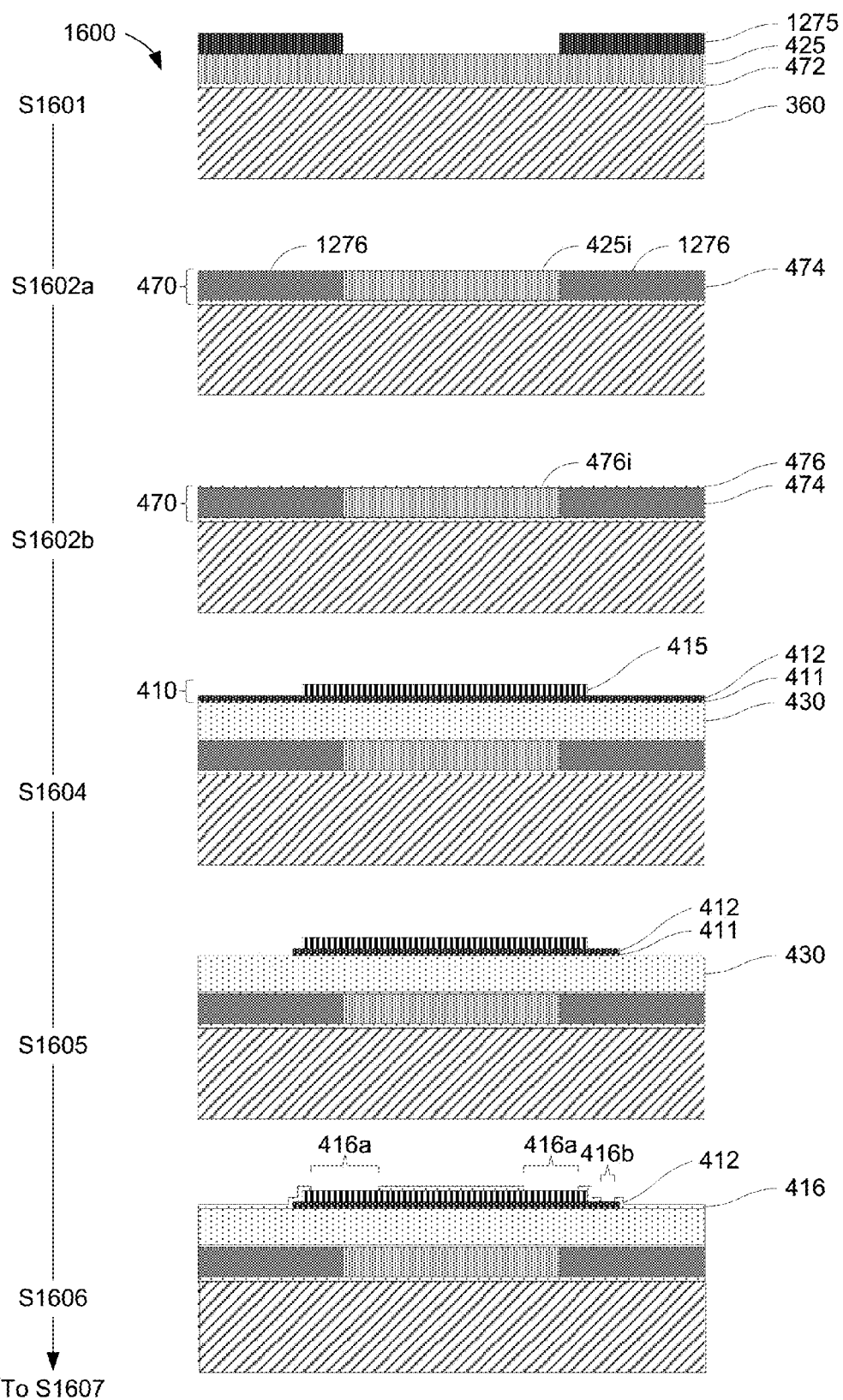
FIGS. 16A and 16B illustrate another example of a process flow for fabricating a PMUT.
Figure 16B:
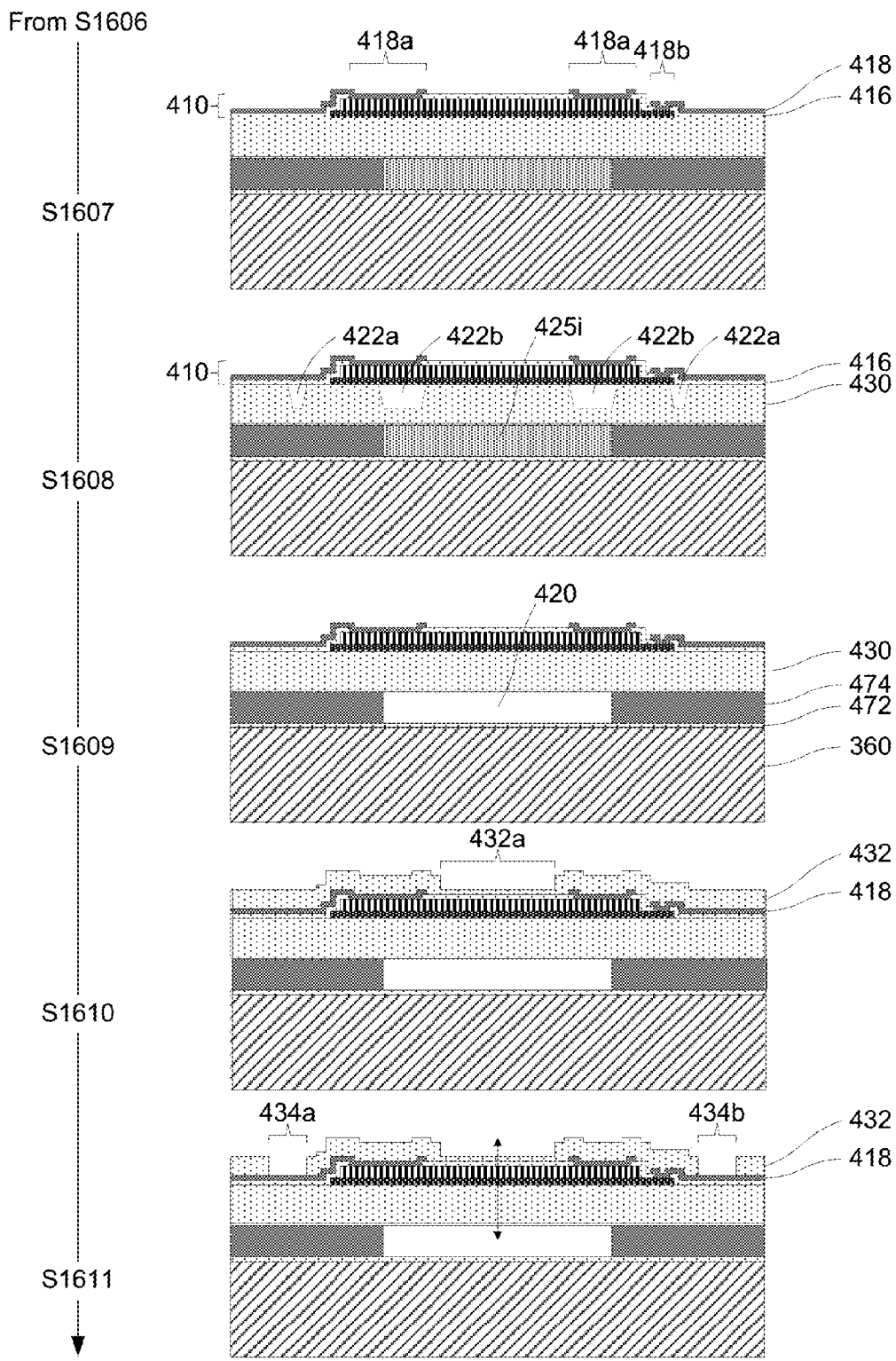

FIGS. 16A and 16B illustrate another example of a process flow for fabricating a PMUT. Process flow 1600 utilizes two layers of metal interconnections for a PMUT with a mechanical layer positioned substantially between the piezoelectric layer stack and the underlying substrate, utilizing a silicide-based planarization method as described above with respect to steps S1202-S1204 of FIG. 12. In step S1601, a substrate 360 is provided upon which to fabricate the PMUTs. A first layer portion 472, such as an oxide buffer or barrier layer, may be deposited on the substrate 360. A sacrificial layer 425 of amorphous or polycrystalline silicon may be deposited on the buffer layer, followed by the deposition of a metal layer such as a nickel layer 1275. The nickel layer 425 may be patterned and etched to expose one or more inner sacrificial regions 425i and outer sacrificial regions 425o (not shown), with the etchant stopping on the sacrificial layer 425. In step S1602a, the nickel layer 1275 and underlying sacrificial layer 425 may be reacted in a high-temperature environment to locally form a silicide layer 1276 such as nickel silicide. Portions of the silicide layer 1276 may form an anchor portion 474 of the anchor structure 470. In step S1602b, a thin barrier layer 476 may be deposited. A portion 476i of the thin barrier layer 476 may reside over the sacrificial regions 425i and 425o. In step S1604, a multilayer stack may be deposited, including a mechanical layer 430, a first layer 411 of the piezoelectric stack 410 that may serve as a seed layer, a lower electrode layer 412, and a piezoelectric layer 415. The piezoelectric layer 415 may be patterned and etched, stopping on the lower electrode layer 412. In step S1605, the lower electrode layer 412 and the underlying seed layer 411 may be patterned and etched, stopping on the mechanical layer 430. In step S1606, a dielectric isolation layer 416 may be deposited, patterned and etched to form electrical vias 416a and 416b that expose portions of the piezoelectric layer 415 and lower electrode layer 412, respectively. Alternatively, electrical coupling between the upper electrode layer 414 and underlying portions of the piezoelectric layer 415 may be achieved capacitively through the dielectric isolation layer 416, allowing excitation and detection of ultrasonic waves from flexural motions and vibrations of piezoelectric layer 415 without direct electrical contact, as described with respect to step S1607 below. In this implementation, one or more electrical vias 416a may be omitted and the dielectric isolation layer 416 would not be etched in the via region (not shown).

Process flow 1600 continues in FIG. 16B with the deposition, patterning and etching of a metal interconnect layer 418 in step S1607. The metal interconnect layer 418 may provide electrical traces and electrical contact 418a to portions of piezoelectric layer 415 and electrical contact 418b to portions of lower electrode layer 412 through electrical vias 416a and 416b, respectively. In the capacitive coupling implementation described with respect to step S1606, the metal interconnect layer 418 may be dielectrically isolated from the piezoelectric layer 415 and one or more electrical vias 416a omitted. In step S1608, one or more recesses 422 may be formed in the mechanical layer 430. Dashed lines in step S1608 for recesses 422a and 422b indicate that their positions, when used, may be formed under etched portions of the piezoelectric layer stack 410. In step S1609, portions of mechanical layer 430 and other layers may be patterned and etched to provide access (not shown) to sacrificial regions 425i, which allows the selective removal of exposed sacrificial material in the sacrificial layer 425, resulting in the formation of one or more cavities 420. In some implementations with thermally decomposable sacrificial materials, direct access to cavities 420 through release holes and release channels may not be required, as described with respect to FIG. 4A-B above. In step S1610, a passivation layer 432 may be deposited over the interconnect layer 418 and exposed portions of the lower electrode layer 412 and upper electrode layer 414. Optionally, one or more upper recesses 432a may be formed in the passivation layer 432. In step S1611, one or more contact pad openings or vias 434a and 434b may be patterned and etched through the passivation layer 432 to provide access to underlying metal features such as bond pads in metal interconnect layer 418.

Figure 17A:
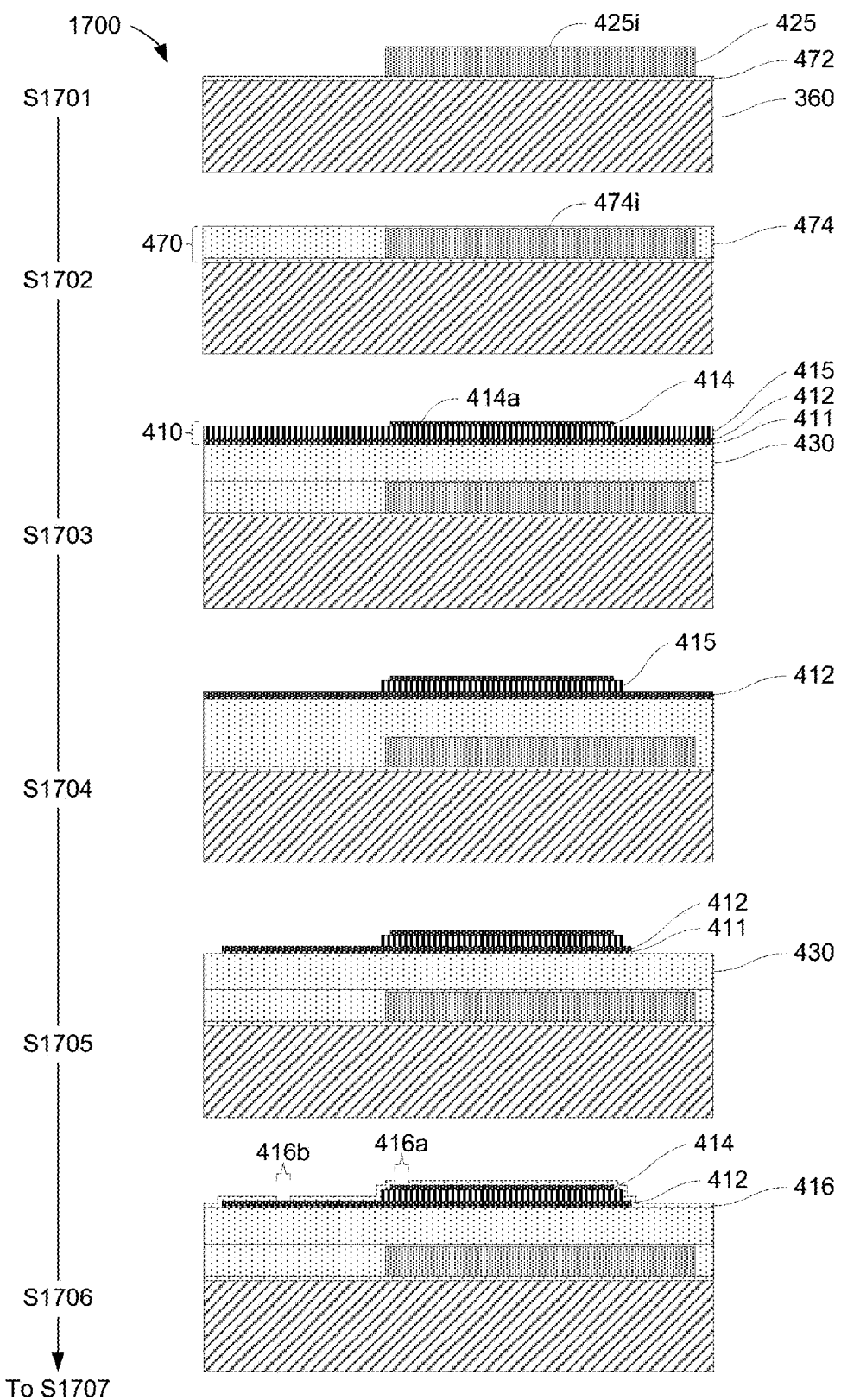
FIGS. 17A and 17B illustrate another example of a process flow for fabricating a PMUT.
Figure 17B:
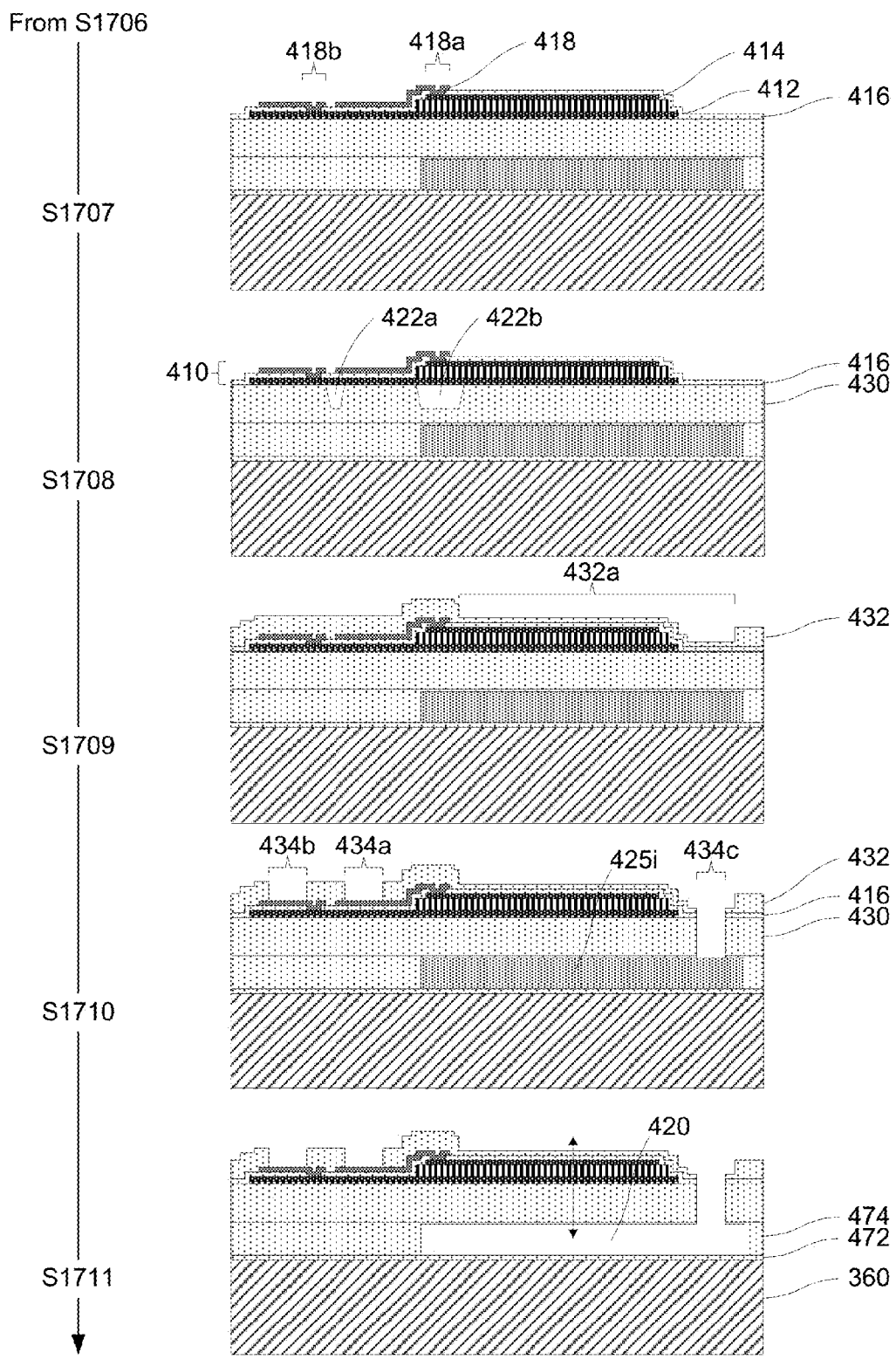

FIGS. 17A and 17B illustrate another example of a process flow for fabricating a PMUT. Process flow 1700 provides three layers of metal interconnections for a PMUT with a mechanical layer positioned substantially between the piezoelectric layer stack and the underlying substrate, providing for an unsealed PMUT that may be subsequently sealed with a laminated or bonded upper mechanical layer (not shown here, but described above with respect to FIGS. 6A-6E). In a first step S1701, a substrate 360 is provided upon which to fabricate the PMUTs. A first layer portion 472, such as an oxide buffer layer, may be deposited on the substrate 360. A sacrificial layer 425 of a sacrificial material may be deposited on the buffer layer. The sacrificial layer 425 may be patterned and etched to form one or more inner sacrificial regions 425i, with the etchant stopping on the underlying buffer layer or substrate. In step S1702, an anchor portion 474 of the anchor structure 470 such as a silicon dioxide layer may be deposited onto the buffer layer and the sacrificial regions, then thinned using CMP to form a substantially planar surface while retaining a small portion 474i of the silicon dioxide layer above the sacrificial region 425i. In step S1703, a multilayer stack may be deposited, including a mechanical layer 430, a first layer 411 of the piezoelectric stack 410 that may serve as a seed layer, a lower electrode layer 412, a piezoelectric layer 415, and an upper electrode layer 414. The upper electrode layer may be patterned and etched to form an upper electrode 414a that is in electrical contact with the piezoelectric layer 415. In step S1704, the piezoelectric layer 415 may be patterned and etched, stopping on the lower electrode layer 412. In step S1705, the lower electrode layer 412 may be patterned and etched along with the underlying seed layer 411, stopping on the mechanical layer 430. In step S1706, a dielectric isolation layer 416 may be deposited, patterned and etched to form electrical vias 416a and 416b that expose portions of the upper electrode layer 414 and lower electrode layer 412, respectively.

Process flow 1700 continues in FIG. 17B with the deposition, patterning and etching of a metal interconnect layer 418 in step S1707. The metal interconnect layer 418 may provide electrical traces and electrical contact 418a to portions of upper electrode layer 414 and electrical contact 418b to portions of lower electrode layer 412 through electrical vias 416a and 416b, respectively. In step S1708, one or more recesses 422 may be formed in mechanical layer 430. Dashed lines in step S1708 for recesses 422a and 422b indicate that their positions, when used, may be formed under etched portions of the piezoelectric layer stack 410. In step S1709, a passivation layer 432 may be deposited over the interconnect layer 418 and exposed portions of the lower electrode layer 412 and upper electrode layer 414. Optionally, one or more upper recesses 432a may be formed in the passivation layer 432. In step S1710, portions of mechanical layer 430 and other layers such as dielectric isolation layer 416 may be patterned and etched to provide access to sacrificial region 425i, which allows the selective removal of exposed sacrificial material in the sacrificial layer 425, resulting in the formation of one or more cavities 420. Also in step S1710, one or more contact pad openings or vias 434a and 434b may be patterned and etched through the passivation layer 432 to provide access to underlying metal features such as bond pads. In step S1711, exposed portions of sacrificial layer 425 in sacrificial region 425i may be selectively etched, stopping on exposed surfaces of the anchor portion 474, first layer portion 472 and substrate 360 and resulting in the formation of one or more cavities 420. In some implementations, an upper mechanical layer 630 (not shown) may be laminated or otherwise bonded to the upper surface of the PMUT, such as described with respect to FIG. 6B. In some implementations, an upper mechanical layer 630 may be coupled to an array of micropillars 636 (not shown), such as described with respect to FIG. 6D.

Figure 18:
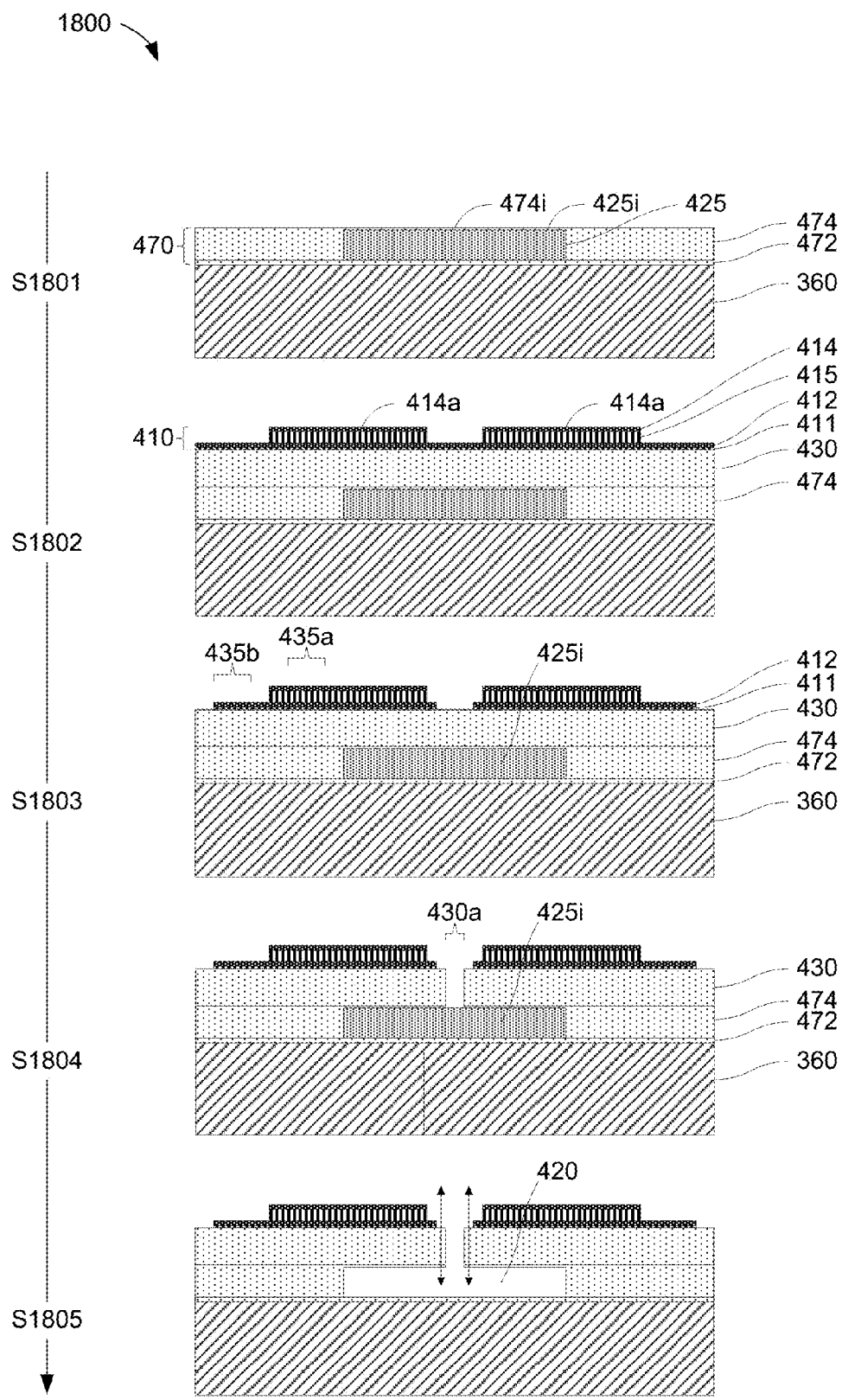
FIG. 18 illustrates another example of a process flow for fabricating a PMUT.

FIG. 18 illustrates another example of a process flow for fabricating a PMUT. Process flow 1800 provides two layers of metal interconnections for a PMUT with a mechanical layer positioned substantially between the piezoelectric layer stack and the underlying substrate, providing for an unsealed PMUT that may be subsequently sealed with a laminated or bonded upper mechanical layer (not shown here, but described above with respect to FIGS. 6A-6E). In a first step S1801, a substrate 360 is provided upon which to fabricate the PMUTs. A first layer portion 472, such as an oxide buffer layer, may be deposited on the substrate 360. A sacrificial layer 425 of a sacrificial material may be deposited on the buffer layer. The sacrificial layer 425 may be patterned and etched to form one or more inner sacrificial regions 425i, with the etchant stopping on the underlying buffer layer or substrate. Also in step S1801, an anchor portion 474 of the anchor structure 470 such as a silicon dioxide layer may be deposited onto the buffer layer and the sacrificial regions, then thinned using CMP to form a substantially planar surface while retaining a small portion 474i of the silicon dioxide layer above the sacrificial region 425i. In step S1802, a multilayer stack may be deposited, including a mechanical layer 430, a first layer 411 of the piezoelectric stack 410 that may serve as a seed layer, a lower electrode layer 412, a piezoelectric layer 415, and an upper electrode layer 414. The upper electrode layer 414 may be patterned and etched to form upper electrodes 414a that are in electrical contact with the piezoelectric layer 415. Also in step S1802, the piezoelectric layer 415 may be etched, stopping on the lower electrode layer 412. In step S1803, the lower electrode layer 412 may be patterned and etched along with the underlying seed layer 411, stopping on the mechanical layer 430 to expose portions 435a and 435b of the upper electrode layer 414 and lower electrode layer 412, respectively, to allow for subsequent wire bonding or the inclusion of an additional interconnect layer (not shown). In step S1804, portions of mechanical layer 430 and any underlying layers may be patterned and etched to form one or more release holes 430a and provide access to sacrificial region 425i. In step S1805, exposed portions of sacrificial layer 425 in sacrificial region 425i may be selectively etched, resulting in the formation of one or more cavities 420. In some implementations, an upper mechanical layer 630 (not shown) may be laminated or otherwise bonded to the upper surface of the PMUT, as described with respect to FIG. 6B. In some implementations, an upper mechanical layer 630 may be coupled to an array of micropillars 636 (not shown), as described with respect to FIG. 6D.

Thus, a PMUT having a mechanical layer disposed above or below a piezoelectric layer stack, providing a seal for an underlying cavity, and techniques for fabrication such a PMUT have been disclosed. It will be appreciated that a number of alternative configurations and fabrication techniques may be contemplated.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by or to control the operation of data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that can be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, as a person having ordinary skill in the art will readily appreciate, the terms "upper" and "lower", "top" and bottom", "front" and "back", and "over", "overlying", "on", "under" and "underlying" are sometimes used for ease of describing the figures and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A piezoelectric micromechanical ultrasonic transducer (PMUT) comprising:
   a multilayer stack disposed on a substrate and including:
       an anchor structure disposed over the substrate;
       a piezoelectric layer stack disposed over the anchor structure
       an acoustic coupling medium disposed above the piezoelectric layer stack; and
       a mechanical layer disposed proximate to the piezoelectric layer stack; wherein:
           the piezoelectric layer stack is disposed over a cavity;
           the mechanical layer seals the cavity and, together with the piezoelectric layer stack, is supported by the anchor structure and forms a membrane over the cavity, the membrane being configured to undergo one or both of flexural motion and vibration when the PMUT receives or transmits ultrasonic signals; and
           the PMUT is configured to receive or transmit ultrasonic signals through the coupling medium.

2. The PMUT of claim 1, wherein the mechanical layer has a thickness such that a neutral axis of the multilayer stack is displaced, relative to a neutral axis of the piezoelectric layer stack, towards the mechanical layer to allow an out-of-plane bending mode.

3. The PMUT of claim 2, wherein the mechanical layer is substantially thicker than the piezoelectric layer stack.

4. The PMUT of claim 2, wherein the neutral axis passes through the mechanical layer.

5. The PMUT of claim 1, wherein:
   the cavity is formed by removing a sacrificial material through at least one release hole;
   the mechanical layer is formed after removing the sacrificial material; and
   forming the mechanical layer seals the cavity by sealing the at least one release hole.

6. The PMUT of claim 1, wherein the piezoelectric layer stack includes a piezoelectric layer, a lower electrode disposed below the piezoelectric layer, and an upper electrode disposed above the piezoelectric layer.

7. The PMUT of claim 1, wherein the mechanical layer includes a recess where the mechanical layer is locally thinned.

8. The PMUT of claim 1, wherein the mechanical layer is disposed over a side of the piezoelectric stack opposite to the substrate.

9. The PMUT of claim 1, wherein the mechanical layer is disposed below a side of the piezoelectric stack facing the substrate.

10. A piezoelectric micromechanical ultrasonic transducer (PMUT) comprising:
    a multilayer stack disposed on a substrate and including:
        an anchor structure disposed over the substrate;
        a piezoelectric layer stack disposed over the anchor structure; and
        a mechanical layer disposed proximate to the piezoelectric layer stack, the mechanical layer including a recess where the mechanical layer is locally thinned;
    wherein
        the piezoelectric layer stack is disposed over a cavity; and
        the mechanical layer, together with the piezoelectric layer stack, is supported by the anchor structure and forms a membrane over the cavity, the membrane being configured to undergo one or both of flexural motion and vibration when the PMUT receives or transmits ultrasonic signals.

11. The PMUT of claim 10, wherein:
    the cavity is formed by removing a sacrificial material through at least one release hole;
    the mechanical layer is formed after removing the sacrificial material; and
    forming the mechanical layer seals the cavity by sealing the at least one release hole.

12. The PMUT of claim 10, wherein the mechanical layer is disposed over a side of the piezoelectric stack opposite to the substrate.

13. The PMUT of claim 10, wherein the mechanical layer is disposed below a side of the piezoelectric stack facing the substrate.

14. The PMUT of claim 10, further comprising an acoustic coupling medium disposed above the piezoelectric layer stack, wherein the PMUT is configured to receive or transmit ultrasonic signals through the coupling medium.

15. An apparatus comprising:
    an array of piezoelectric micromechanical ultrasonic transducer (PMUT) sensors; and
    an acoustic coupling medium, wherein:
        at least one PMUT includes a multilayer stack disposed on a substrate and including an anchor structure disposed over the substrate, a piezoelectric layer stack disposed over the anchor structure and a cavity, and a mechanical layer disposed proximate to the piezoelectric layer stack, the mechanical layer sealing the cavity;
        the acoustic coupling medium is disposed above the piezoelectric layer stack; and
        the PMUT is configured to receive or transmit ultrasonic signals through the coupling medium.

16. The apparatus of claim 15, wherein the mechanical layer, together with the piezoelectric layer stack, forms a membrane over the cavity, the membrane being configured to undergo one or both of flexural motion and vibration when the PMUT receives or transmits ultrasonic signals.

17. The apparatus of claim 15, wherein the mechanical layer has a thickness such that a neutral axis of the multilayer stack is displaced, relative to a neutral axis of the piezoelectric layer stack, towards the mechanical layer to allow an out-of-plane bending mode.

18. The apparatus of claim 17, wherein the mechanical layer is substantially thicker than the piezoelectric layer stack.

19. The apparatus of claim 17, wherein the neutral axis passes through the mechanical layer.

20. The apparatus of claim 15, wherein:
the cavity is formed by removing a sacrificial material through at least one release hole;
the mechanical layer is formed after removing the sacrificial material; and
the mechanical layer seals the cavity by sealing the at least one release hole.

21. The apparatus of claim 15, wherein the mechanical layer includes a recess where the mechanical layer is locally thinned.

22. The apparatus of claim 15, wherein the mechanical layer is disposed over a side of the piezoelectric stack opposite to the substrate or below a side of the piezoelectric stack facing the substrate.

* * * * *